(12) United States Patent
Yang et al.

(10) Patent No.: US 12,730,270 B2
(45) Date of Patent: Sep. 8, 2026

(54) CONNECTOR ASSEMBLY

(71) Applicant: Molex, LLC, Lisle, IL (US)

(72) Inventors: Che-Yuan Yang, New Taipei City (TW); Ya-Li Xu, New Taipei City (TW)

(73) Assignee: Molex, LLC, Lisle, IL (US)

( * ) Notice: Subject to any disclaimer, the term of this patent is extended or adjusted under 35 U.S.C. 154(b) by 501 days.

(21) Appl. No.: 18/219,094

(22) Filed: Jul. 7, 2023

(65) Prior Publication Data

US 2024/0027709 A1 Jan. 25, 2024

(30) Foreign Application Priority Data

Jul. 22, 2022 (CN) ......................... 202210867464.7

(51) Int. Cl.

*G02B 6/42* (2006.01)
*H01R 13/502* (2006.01)
*H05K 7/20* (2006.01)

(52) U.S. Cl.

CPC ......... *G02B 6/4269* (2013.01); *G02B 6/4261* (2013.01); *H01R 13/502* (2013.01); *H05K 7/2049* (2013.01)

(58) Field of Classification Search

CPC .. G02B 6/4269; G02B 6/4261; H01R 13/502; H05K 7/2049

(Continued)

(56) References Cited

U.S. PATENT DOCUMENTS 9,453,972 B1 9/2016 Arvelo
10,222,844 B1 3/2019 Reddy et al.
(Continued)

FOREIGN PATENT DOCUMENTS

CN 103201911 B 9/2016
CN 208655988 U 3/2019
(Continued)

*Primary Examiner* — Jerry M Blevins

(57) ABSTRACT

A connector assembly includes a cage having at least one inserting passageway and a heat sink frame positioned above the inserting passageway, the heat sink module is assembled to the heat sink frame, the heat sink module includes a movable plate, a heat sink, a pressure-applying spring and a supporting spring; the movable plate has a pushed portion which enters into the inserting passageway, the pressure-applying spring is provided between the movable plate and the heat sink, the supporting spring upwardly and elastically supports the heat sink; the movable plate is capable of moving relative to the heat sink frame between a first position which is in the front and a second position which is in the rear, the heat sink is capable of moving relative to the heat sink frame between a release position which is in the up and a contact position which is in the down. A pluggable module is capable of inserting into the inserting passageway of the cage along an inserting direction which is from front to rear so as to push the pushed portion of the movable plate and make the movable plate rearwardly move from the first position to the second position, in turn the movable plate brings the pressure-applying spring to move to actuate the heat sink from the release position which is in the up to move to the contact position which is in the down to contact a surface of the pluggable module.

23 Claims, 34 Drawing Sheets

(58) Field of Classification Search
USPC .......................................................... 385/14
See application file for complete search history.

(56) References Cited

U.S. PATENT DOCUMENTS

| | | | |
|---|---|---|---|
| 10,320,113 B2 | 6/2019 | Khazen et al. | |
| 10,588,243 B2 | 3/2020 | Little et al. | |
| 10,651,598 B2 | 5/2020 | Chen et al. | |
| 10,965,333 B2 | 3/2021 | English et al. | |
| 2018/0034492 A1 | 2/2018 | Edgren et al. | |
| 2019/0116692 A1 | 4/2019 | Little et al. | |
| 2021/0013679 A1 | 1/2021 | Chen | |
| 2021/0307204 A1* | 9/2021 | Lu | H05K 7/20418 |

FOREIGN PATENT DOCUMENTS

| | | |
|---|---|---|
| CN | 210404248 U | 4/2020 |
| CN | 108987966 B | 3/2021 |
| CN | 110249718 B | 4/2021 |
| CN | 113937540 A | 1/2022 |
| CN | 114623722 A | 6/2022 |
| JP | 2012048952 A | 3/2012 |
| TW | I728765 B | 5/2021 |
| TW | 202137650 A | 10/2021 |
| TW | 202203522 A | 1/2022 |
| TW | I757113 B | 3/2022 |
| TW | 202220309 A | 5/2022 |
| TW | I763384 B | 5/2022 |
| TW | I768539 B | 6/2022 |
| WO | 2018132437 A1 | 7/2018 |
| WO | 2020191116 A1 | 9/2020 |

* cited by examiner

CONNECTOR ASSEMBLY

RELATED APPLICATION

The present application claims priority to Chinese Patent Application No. 202210867464.7 filed on Jul. 22, 2022, which is incorporated by reference in its entirety.

TECHNICAL FIELD

The present disclosure relates to a connector, and particularly relates to a connector assembly.

BACKGROUND

Chinese invention patent application publication No. CN110296628A (corresponding U.S. Pat. No. 10,651,598B2) discloses a heat exchange structure, which includes a metal member, a lever and a frame, the frame is used to support the lever and the metal member, a front end of the metal member is fixed on a front edge of the frame by a fastener such as a rivet. When a heat source slides relative to a heat sink, the heat source contacts one end of the lever to actuate the other end of the lever to contact a rear end of the metal member, the metal member downwardly pushes the heat sink and a thermal conductive pad to contact the heat source.

However, this prior art needs to additionally provide the one frame which is used to mount the lever and the metal member. And the metal member needs to be provided on a top surface of the heat sink, thereby resulting in that the heat sink needs to open a groove which is used to mount the metal member, lowering a heat dissipating area of the heat sink. And, the metal member only uses a single point (screw) to engage with the heat sink, when the lever is pushed, the lever presses down on the rear end of the metal member, which would make the heat sink easily skewed. Moreover, the metal member needs a space which can permit the metal member to elastically deform and move up and down, together with that the lever needs an up-down pace and a front-rear space which can permit the lever to rotate and swing, so a large amount of a space of the heat sink is occupied, and it is difficult to make the entire of the heat sink thinned.

SUMMARY

Therefore, one object of the present disclosure is to provide a connector assembly which can improve at least one problem in the prior art.

Accordingly, in some embodiments, a connector assembly of the present disclosure comprises a cage, a heat sink module and a pluggable module. The cage has at least one inserting passageway and a heat sink frame positioned above the inserting passageway. The heat sink module is assembled to the heat sink frame, the heat sink module comprises a movable plate, a heat sink, a pressure-applying spring and a supporting spring; the movable plate has a pushed portion which enters into the inserting passageway, the pressure-applying spring is provided between the movable plate and the heat sink, the supporting spring upwardly and elastically supports the heat sink; the movable plate is capable of moving relative to the heat sink frame between a first position which is in the front and a second position which is in the rear, the heat sink is capable of moving relative to the heat sink frame between a release position which is in the up and a contact position which is in the down. The pluggable module is capable of inserting into the inserting passageway of the cage along an inserting direction which is from front to rear so as to push the pushed portion of the movable plate and make the movable plate rearwardly move from the first position to the second position, in turn the movable plate brings the pressure-applying spring to move to actuate the heat sink from the release position which is in the up to move to the contact position which is in the down and make the supporting spring compressed, an elastic acting force of the pressure-applying spring makes a bottom portion of the heat sink downwardly contact a surface of the pluggable module with a pressure; when the pluggable module withdraws from the inserting passageway, the supporting spring upwardly raises the heat sink to move to the release position where the heat sink does not contact the surface of the pluggable module, the pressure-applying spring actuates the movable plate to forwardly move to the first position.

In some embodiments, the pressure-applying spring is integrally constructed on the movable plate; the heat sink frame is constructed with a pressure-applying spring acting construction; when the movable plate rearwardly moves from the first position to the second position, the pressure-applying spring on the movable plate and the pressure-applying spring acting construction of the heat sink frame act to make the movable plate downwardly move and in turn bring the heat sink to move downwardly from the release position and move to the contact position.

In some embodiments, the pressure-applying spring comprises a plurality of plate spring portions which are constructed to two sides of the movable plate and are arranged in a front-rear direction, the plurality of plate spring portions of the pressure-applying spring obliquely extend forwardly and upwardly, the heat sink frame has an upper wall, the pressure-applying spring acting construction comprises a plurality of interfering pieces which are constructed to the upper wall of the heat sink frame, when the movable plate is positioned in the first position, the interfering pieces of the pressure-applying spring acting construction are respectively positioned behind the plate spring portions of the pressure-applying spring; when the movable plate is positioned in the second position, the interfering pieces of the pressure-applying spring acting construction downwardly act to the plate spring portions of the pressure-applying spring.

In some embodiments, the pressure-applying spring is assembled on the heat sink, the movable plate is constructed with a pressure-applying spring acting construction, when the movable plate rearwardly moves from the first position to the second position, the pressure-applying spring acting construction on the movable plate and the pressure-applying spring on the heat sink act, in turn bring the heat sink to move downwardly from the release position and move to the contact position.

In some embodiments, the pressure-applying spring comprises a plurality of plate spring portions which are assembled to two sides of the heat sink and are arranged in a front-rear direction, the plurality of plate spring portions of the pressure-applying spring obliquely extend rearwardly and upwardly, the pressure-applying spring acting construction comprises a plurality of interfering pieces which are constructed to two sides of the movable plate, when the movable plate is positioned in the first position, the interfering pieces of the pressure-applying spring acting construction are respectively positioned in front of the plate spring portions of the pressure-applying spring, when the movable plate is positioned in the second position, the interfering pieces of the pressure-applying spring acting construction downwardly act to the plate spring portions of the pressure-applying spring.

In some embodiments, the pressure-applying spring is integrally constructed on the movable plate, the heat sink is constructed with a pressure-applying spring acting construction, when the movable plate rearwardly moves from the first position to the second position, the pressure-applying spring on the movable plate and the pressure-applying spring acting construction of the heat sink act, in turn bring the heat sink to move downwardly from the release position and move to the contact position.

In some embodiments, the pressure-applying spring comprises a plurality of plate spring portions which are constructed to two sides of the movable plate and are arranged in a front-rear direction, the plurality of plate spring portions of the pressure-applying spring obliquely extend forwardly and downwardly, the pressure-applying spring acting construction comprises a plurality of interfering oblique surfaces which are constructed to two sides of the heat sink and obliquely extend rearwardly and upwardly, when the movable plate is positioned in the first position, the interfering oblique surfaces of the pressure-applying spring acting construction are respectively positioned behind the plate spring portions of the pressure-applying spring, when the movable plate is positioned in the second position, the plate spring portions of the pressure-applying spring downwardly act to the interfering oblique surfaces of the pressure-applying spring acting construction.

In some embodiments, the heat sink module further comprises a position-restoring spring which is provided between the heat sink frame and the movable plate, the position-restoring spring is used to provide an elastic acting force that the movable plate moves to the first position.

In some embodiments, the heat sink frame has a first hook portion which is positioned at a front end of the heat sink frame, the movable plate has a second hook portion which is positioned at a front end of the movable plate, the position-restoring spring is a coil spring, a front end of the position-restoring spring connects the first hook portion, a rear end of the position-restoring spring connects the second hook portion.

In some embodiments, the supporting spring comprises at least two supporting spring constructions, the two supporting spring constructions are respectively constructed on the heat sink frame and support a left side and a right side of the heat sink.

In some embodiments, the supporting spring construction comprises two elastic supporting portions which upwardly support the heat sink and are plate-shaped, the two elastic supporting portions upwardly and respectively forwardly and rearwardly extend obliquely.

In some embodiments, the heat sink frame and the heat sink are provided therebetween with a heat sink guiding construction, the heat sink guiding construction limits movement of the heat sink in a front-rear direction and guides movement of the heat sink in an up-down direction.

In some embodiments, the heat sink guiding construction comprises guiding holes which are constructed on side walls of the heat sink frame and guiding protrusions which are constructed on side edges of the heat sink, the guiding protrusion is provided to the guiding hole and is capable of moving up and down.

Accordingly, in some embodiments, a connector assembly of the present disclosure comprises a cage at least one heat sink module and a pluggable module. The cage has at least one inserting passageway and at least one heat sink frame positioned above the inserting passageway. The heat sink module is assembled to the heat sink frame, the heat sink module comprises a movable plate, a heat sink, a pressure-applying spring, a supporting spring and a movable plate guiding construction; the movable plate has a pushed portion which enters into the inserting passageway, the pressure-applying spring is provided between the movable plate and the heat sink, the supporting spring upwardly and elastically supports the heat sink; the movable plate is capable of being guided by the movable plate guiding construction to move relative to the heat sink frame between in a first position which is in the front and in the up and a second position which is in the rear and in the down, the heat sink is capable of moving relative to the heat sink frame between a release position which is in the up and a contact position which is in the down. The pluggable module is capable of inserting into the inserting passageway of the cage along an inserting direction which is from front to rear to push the pushed portion of the movable plate and make the movable plate rearwardly move from the first position to the second position, in turn the movable plate brings the pressure-applying spring to move and actuate the heat sink to move from the release position which is in the up to the contact position which is in the down and make the supporting spring compressed, an elastic acting force of the pressure-applying spring makes a bottom portion of the heat sink downwardly contact a surface of the pluggable module with a pressure; when the pluggable module withdraws from the inserting passageway, the supporting spring upwardly raises the heat sink to move to the release position where the heat sink does not contact the surface of the pluggable module, the pressure-applying spring actuates the movable plate to forwardly move to the first position.

In some embodiments, the heat sink frame has side walls, the movable plate guiding construction comprises guiding members and guiding grooves which cooperate with each other, the guiding grooves are constructed on the side walls of the heat sink frame and obliquely extend rearwardly and downwardly, the guiding members are constructed on side edges of the movable plate and are assembled into the guiding grooves, the guiding members are capable of moving along the guiding grooves.

In some embodiments, the pressure-applying spring is integrally constructed on the movable plate; when the movable plate rearwardly moves from the first position to the second position, the pressure-applying spring on the movable plate directly acts to the heat sink, in turn brings the heat sink to move downwardly from the release position and move to the contact position.

In some embodiments, the pressure-applying spring comprises a plurality of plate spring portions which are constructed to two sides of the movable plate and are arranged in a front-rear direction, the plurality of plate spring portions of the pressure-applying spring obliquely extend forwardly and downwardly.

In some embodiments, the supporting spring is constructed on the movable plate, the supporting spring comprises a supporting brace which braces the heat sink from down to up, the supporting brace of the supporting spring upwardly and elastically supports the heat sink.

In some embodiments, the heat sink frame has a lower wall, the supporting spring comprises a plurality of the supporting braces which are constructed to two sides of the movable plate and a plurality of elastic abutting portions which are constructed to the two sides of the movable plate and downwardly elastically abut against the lower wall of the heat sink frame, the supporting brace has a supporting hook which extends downwardly and inwardly and is used to hook a side edge of the heat sink, the plurality of elastic abutting portion downwardly and respectively forwardly and rearwardly extend obliquely.

In some embodiments, the supporting spring comprises at least two supporting spring constructions, the two supporting spring constructions are respectively constructed on the heat sink frame and support a left side and a right side of the heat sink.

In some embodiments, the supporting spring construction comprises two elastic supporting portions which upwardly support the heat sink and are plate-shaped, the two elastic supporting portions upwardly and respectively forwardly and rearwardly extend obliquely.

In some embodiments, the heat sink frame and the heat sink are provided therebetween with a heat sink guiding construction, the heat sink guiding construction limits movement of the heat sink in a front-rear direction and guides movement of the heat sink in an up-down direction.

In some embodiments, the heat sink guiding construction comprises guiding holes which are constructed on side walls of the heat sink frame and guiding protrusions which are constructed on side edges of the heat sink, the guiding protrusion is provided to the guiding hole and is capable of moving up and down.

In the present disclosure, by that the rearward movement of the movable plate brings the pressure-applying spring to move and the pressure-applying spring actuates the heat sink to move to the contact position where the heat sink contacts the pluggable module, so, only after the pluggable module inserts into the inserting passageway of the cage, can the heat sink moves to a position where the heat sink contacts the surface of the pluggable module, so as to reduce friction situation generated between the bottom portion of the heat sink and the pluggable module in a process that the pluggable module inserts into the connector assembly, prevent the bottom portion of the heat sink from being worn, or prevent the thermal interface material provided to the bottom portion of the heat sink from being scratched. Further, by that the elastic acting force of the pressure-applying spring makes the bottom portion of the heat sink downwardly contact the surface of the pluggable module with a pressure, thermal transfer efficiency can be promoted and heat dissipating effect can be increased. On the other hand, by the movable plate which is a thin plate construction and the pressure-applying spring which is positioned between the movable plate and the heat sink, the entire heat dissipating assembly can have a low-profile construction effect. Moreover, the plurality of the plate spring portions of the pressure-applying spring between the movable plate and the heat sink 4 are respectively provided at the two sides of the heat sink and are arranged in the front-rear direction, movement of the heat sink can be more balanced and stable.

BRIEF DESCRIPTION OF THE DRAWINGS

Other features and effects of the present disclosure will be apparent from embodiments referring to the drawings, in which.

DETAILED DESCRIPTION OF THE PREFERRED EMBODIMENTS

Figure 1:
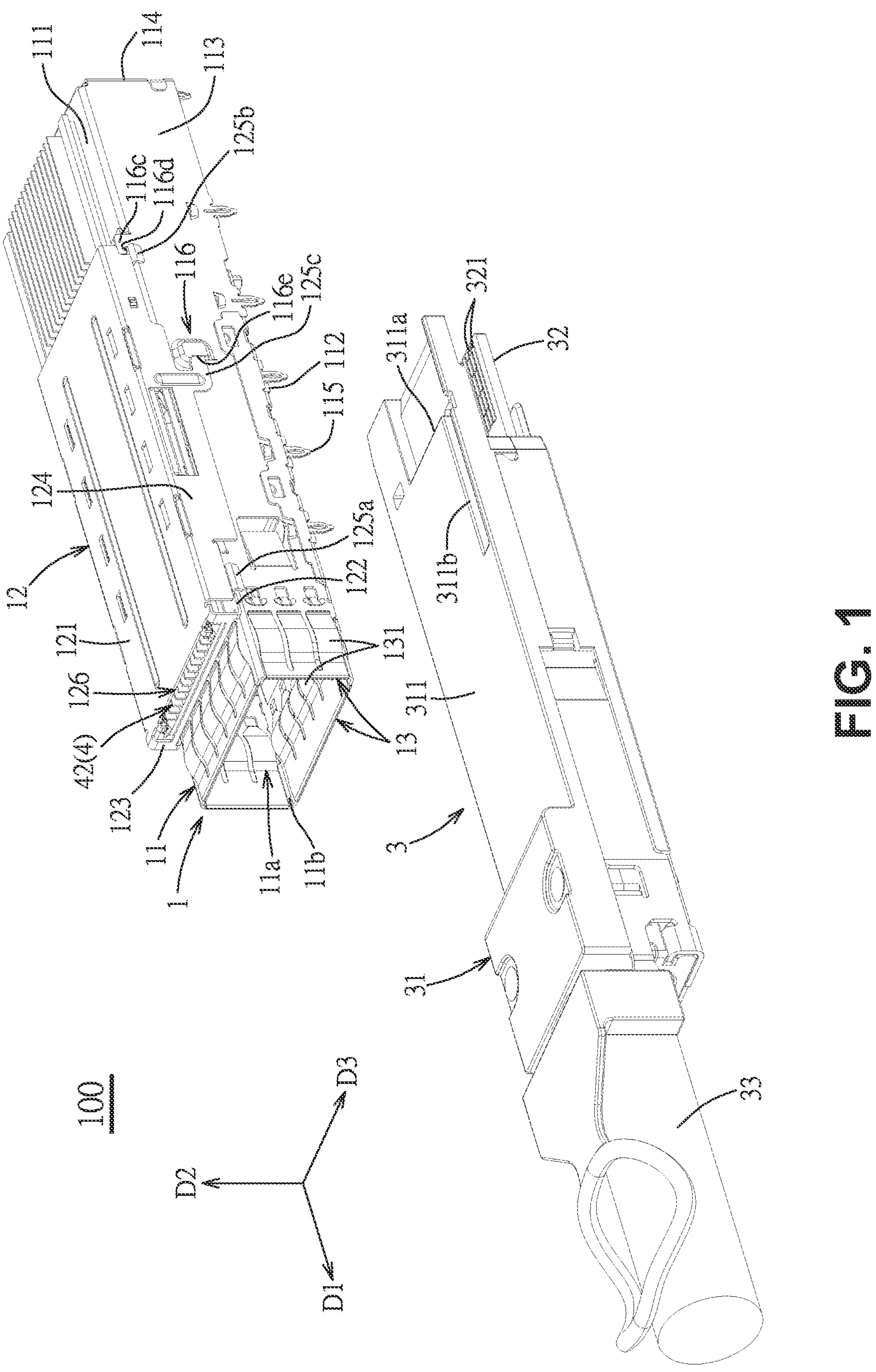
FIG. 1 is a perspective view of a first embodiment of a connector assembly of the present disclosure, in which a pluggable module does not insert into an inserting passageway of a cage.

Before the present disclosure is described in detail, it is noted that like elements are represented by the same reference numerals in the following description.

Figure 2:
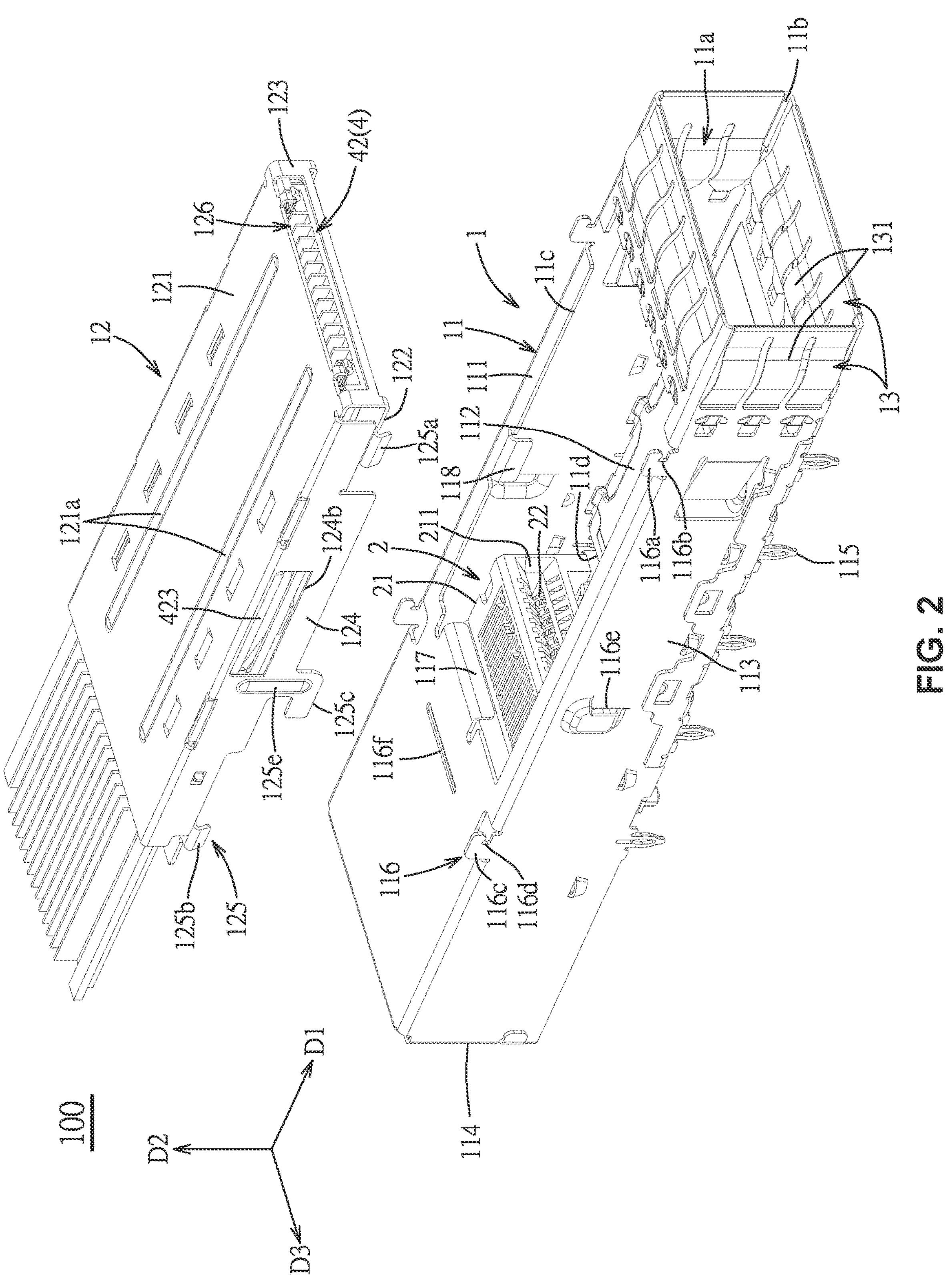
FIG. 2 is a perspective exploded view of the first embodiment.
Figure 3:
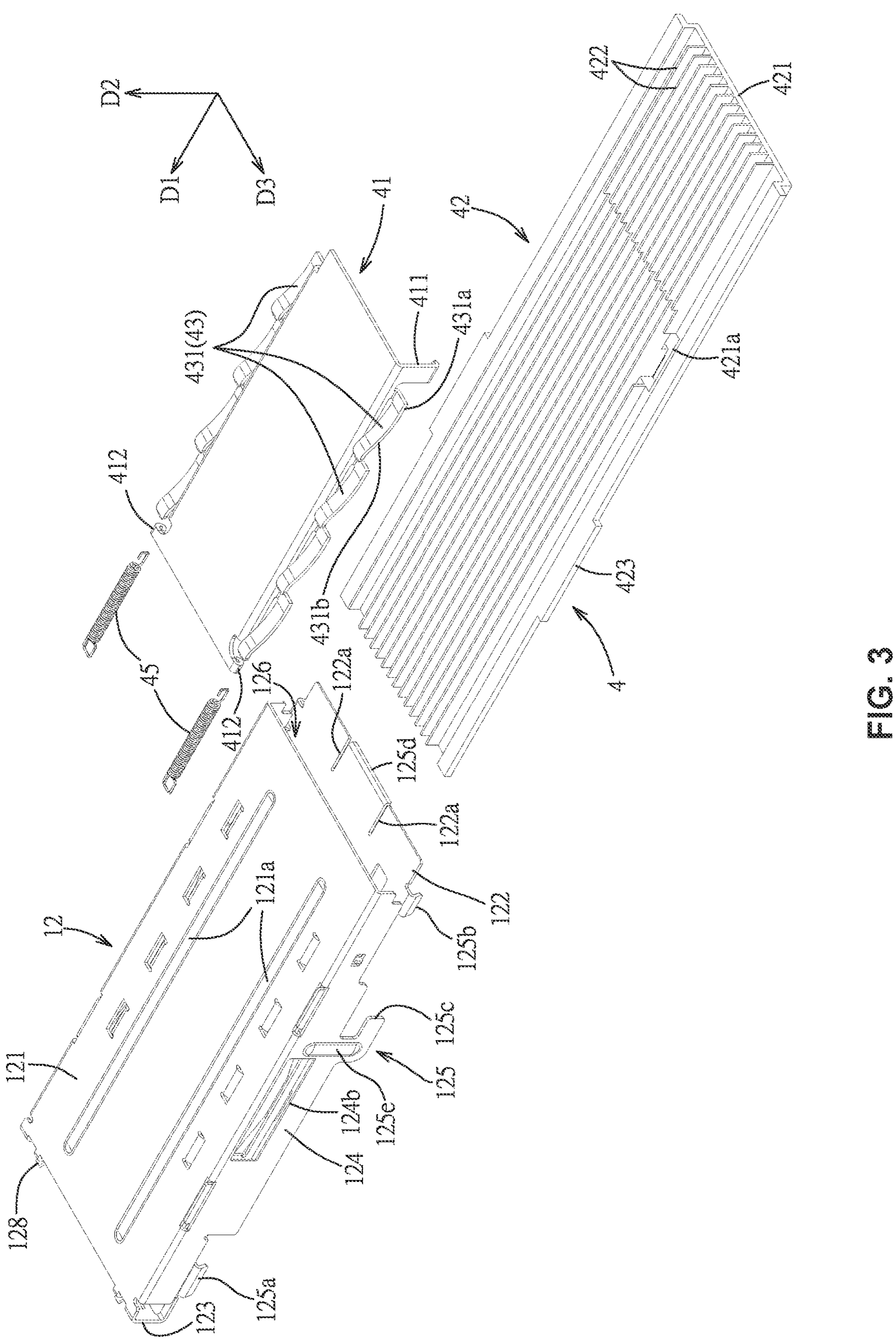
FIG. 3 is a perspective exploded view of a heat sink frame and a heat sink module of the first embodiment.
Figure 4:
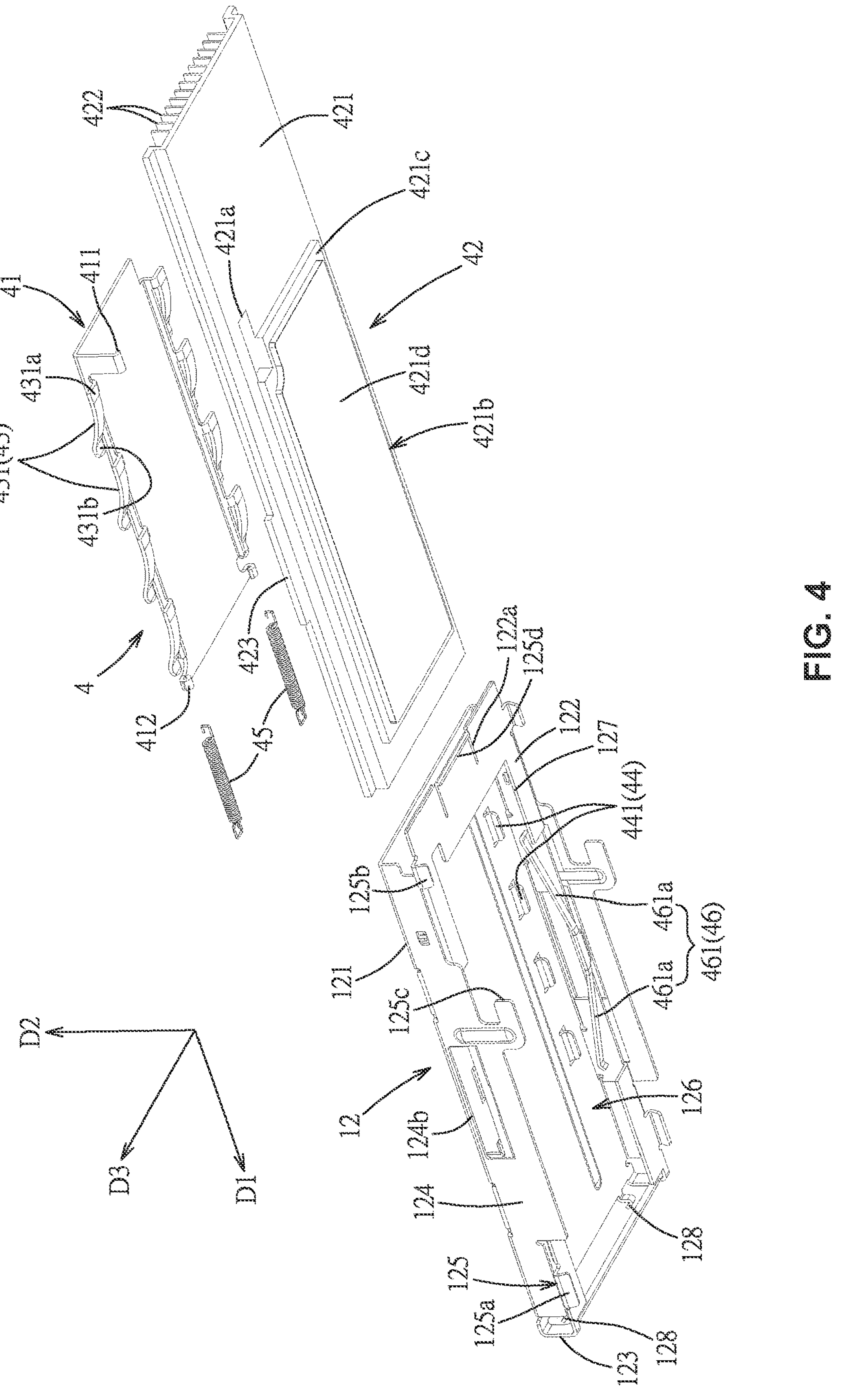
FIG. 4 is a perspective exploded view of the heat sink frame and the heat sink module of the first embodiment of FIG. 3 viewed from another angle.
Figure 5:
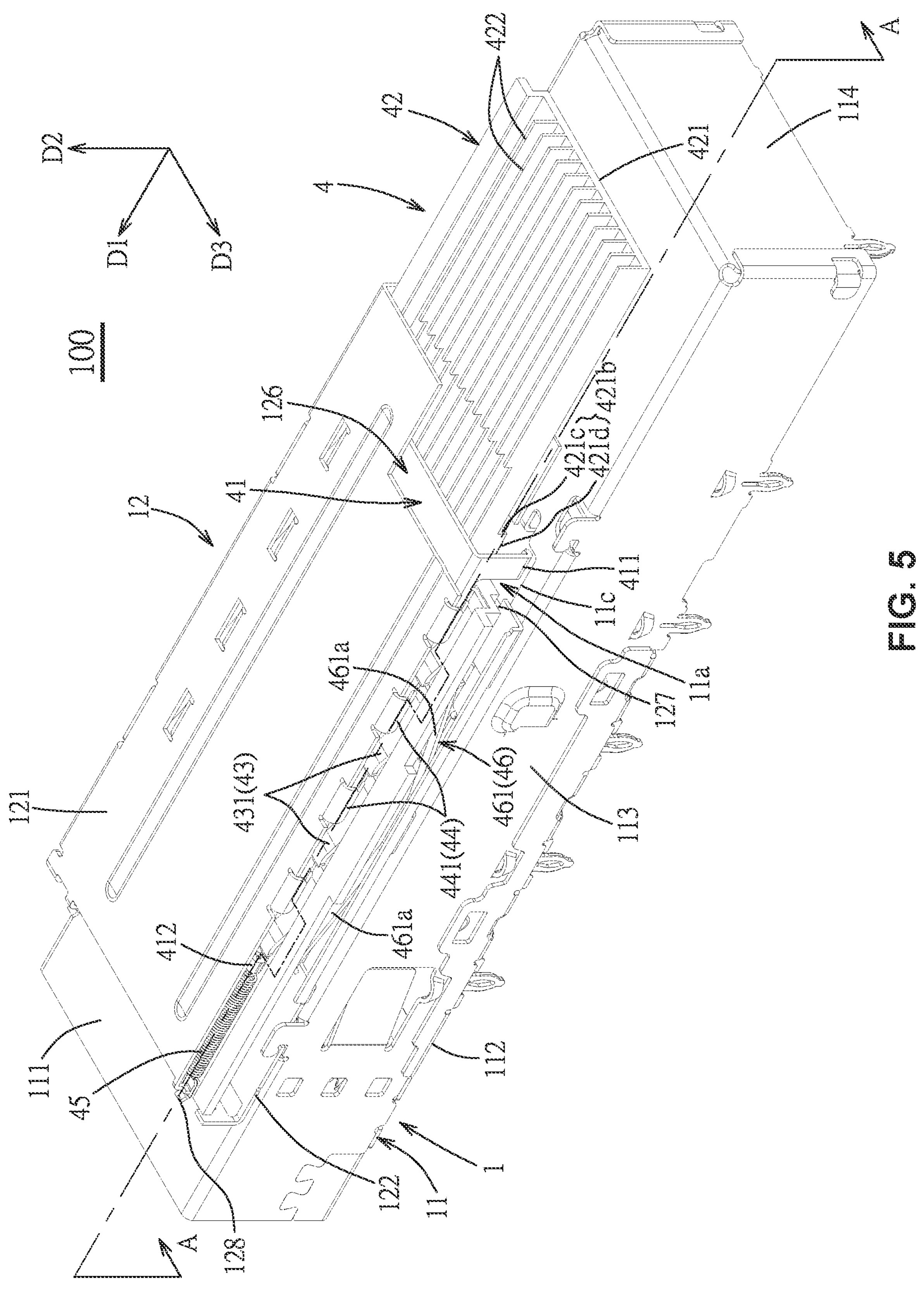
FIG. 5 is a partially cut perspective view of the first embodiment, in which a movable plate of the heat sink module is positioned in a first position and a heat sink of the heat sink module is positioned in a release position.

Referring to FIG. 1 to FIG. 2, a first embodiment of a connector assembly 100 of the present disclosure includes a cage 1, a receptacle connector 2, a pluggable module 3 and a heat sink module 4.

The cage 1 includes a shell 11 and a heat sink frame 12 provided to the shell 11. The shell 11 and the heat sink frame 12 for example each are constructed by a metal plate, for example constructed by processing, such as stamping and bending, a metal thin plate with a mold. The shell 11 is used to be provided to a substrate (for example, a circuit board, not shown) and extends along a front-rear direction D1 (a direction to which an arrow points is front, and an opposite direction is rear). The shell 11 has a top wall 111, a bottom wall 112 which is spaced apart from the top wall 111 along an up-down direction D2 (a direction to which an arrow points is up, and an opposite direction is down), two side walls 113 which are spaced apart from along a left-right direction D3 (a direction to which an arrow points is right, and an opposite direction is left) and are connected between the top wall 111 and the bottom wall 112, a rear wall 114 which is connected to a rear edge of the top wall 111 and rear edges of the two side walls 113, and a plurality of inserting legs 115 which extend downwardly from the two side walls 113 and are adapted to be fixed on the circuit board and/or be connected to a grounding trace (not shown). In addition, the shell 11 further has an inserting passageway 11*a* which is constructed and defined together by the top wall 111, the bottom wall 112, the two side walls 113 and the rear wall 114 and is positioned in an interior of the shell 11, a front end inserting port 11*b* which is positioned at a front end of the shell 11, is communicated with the inserting passageway 11*a* and allows the pluggable module 3 to insert therein, a window 11*c* which is formed to the top wall 111, extends rearwardly from a position of a front segment of the top wall 111 and is communicated with the inserting passageway 11*a*, and a bottom opening 11*d* which is positioned behind the bottom wall 112 and is communicated with the inserting passageway 11*a*.

The receptacle connector 2 is mechanically and electrically provided to the circuit board. The receptacle connector 2 has a housing body 21 which is insulative and a plurality of terminals 22, the housing body 21 has a mating slot 211, the plurality of terminals 22 are provided in the mating slot 211 and tails (not shown) of the plurality of terminals 22 are electrically and mechanically connected to the circuit board. The receptacle connector 2 is provided to a rear segment of the inserting passageway 11*a* via the bottom opening 11*d* so as to be covered by the shell 11, but the present disclosure is not limited thereto. In another embodiment, the receptacle connector 2 may be assembled into the shell 11 from a rear end of the cage 1 of the shell 11, the tails of the plurality of terminals 22 may be electrically and mechanically connected to a plurality of conductive wires (not shown) and the plurality of conductive wires extend out of the rear end of the shell 11 of the cage 1 to be connected to another device (not shown).

The pluggable module 3 includes an outer housing 31, a mating board 32, and a cable 33. The outer housing 31 includes an inserting portion 311, the mating board 32 is positioned to a tip of the inserting portion 311 and the mating board 32 has a plurality of contacting fingers 321 thereon, the cable 33 is mechanically and electrically connected to the mating board 32. The pluggable module 3 inserts into the inserting passageway 11*a* of the shell 11 of the cage 1 from the front end inserting port 11*b* along an inserting direction which is from front to rear, and then the mating board 32 which is at the tip of the inserting portion 311 of the pluggable module 3 can insert into the mating slot 211 of the receptacle connector 2, so that the plurality of contacting fingers 321 of the mating board 32 contact the plurality of terminals 22 in the mating slot 211 of the receptacle connector 2, and consequently the pluggable module 3 and the receptacle connector 2 mate with each other. Moreover, a location of the front segment of the shell 11 of the cage 1 adjacent to the front end inserting port 11*b* may be provided to a mounting hole of a casing (not shown), a plurality of grounding members 13 are further provided at the front end inserting port 11*b* of the cage 1, the plurality of grounding members 13 have a plurality of elastic fingers 131 which extend rearwardly from a position where the front end inserting port 11*b* is presented and are distributed to an outer side and an inner side of the shell 11 of the cage 1, the elastic fingers 131 of the plurality of elastic fingers 131 which is positioned at the outer side of the shell 11 of the cage 1 is used to contact a part of a circumferential edge of the mounting hole of the casing, the elastic fingers 131 of the plurality of elastic fingers 131 which is positioned at the inner side of the shell 11 of the cage 1 is used to contact the pluggable module 3.

In addition, it is noted that, in the first embodiment, the shell 11 is further formed with a stopping piece 117 which extends downwardly from a rear edge of the window 11*c* and a guiding piece 118 which extends downwardly from a side edge of the window 11*c*, a top surface of the inserting portion 311 of the pluggable module 3 is formed with a stopping portion 311*a* which can be stopped by the stopping piece 117 and a guiding groove 311*b* which is used to accommodate the guiding piece 118 to generate a guiding function.

Referring to FIG. 1 to FIG. 5, the heat sink frame 12 of the cage 1 is positioned above the inserting passageway 11*a* and is provided on the top wall 111 of the shell 11 of the cage 1. The shell 11 has a first assembling construction 116 which is used to be assembled to the heat sink frame 12, the heat sink frame 12 has an upper wall 121 and a lower wall 122 which face each other along the up-down direction D2, a front connecting wall 123 which is connected between a front edge of the upper wall 121 and a front edge of the lower wall 122, two side walls 124 which extend downwardly from a left side edge and a right side edge of the upper wall 121 respectively, and a second assembling construction 125 which is used to be correspondingly assembled with the first assembling construction 116.

The first assembling construction 116 includes two front assembling pieces 116*a* which extend upwardly from front segments of the two side walls 113 respectively and each have a front limiting-position groove 116*b* opened forwardly, two rear assembling pieces 116*c* which extend upwardly from rear segments of the two side walls 113 respectively and each have a rear limiting-position groove 116*d* opened forwardly, two inserting holes 116*e* which are formed to the two side walls 113 respectively and are opened forwardly, and a positioning latch hole 116*f* which is positioned behind the window 11*c*, is formed to the top wall 111 and extends along the left-right direction D3. The second assembling construction 125 includes two front limiting-position pieces 125*a* which extend outwardly from front segments of two side edges of the lower wall 122 respectively and are used to rearwardly snap into the two front limiting-position grooves 116*b* respectively, two rear limiting-position pieces 125*b* which extend outwardly from rear segments of the two side edges of the lower wall 122 respectively and are used to rearwardly snap into the two rear limiting-position grooves 116*d* respectively, two inserting pieces 125*c* which extend downwardly and rearwardly from the two side walls 124 respectively and are used to rearwardly insert into the two inserting holes 116*e* respectively, and a positioning latch piece 125*d* which is formed to a rear end of the lower wall 122 and is used to downwardly latch with the positioning latch hole 116*f*. By that the two front limiting-position pieces 125*a* respectively snap into the two front limiting-position grooves 116*b* and the two rear limiting-position pieces 125*b* respectively snap into the two rear limiting-position grooves 116*d*, a position of the heat sink frame 12 relative to the shell 11 in the up-down direction D2 can be limited, and, the two front limiting-position pieces 125*a* and the two rear limiting-position pieces 125*b* bend downwardly and abut against outer side surfaces of the two side walls 113 of the shell 11 respectively to limit a position of the heat sink frame 12 relative to the shell 11 in the left-right direction D3. By that the two inserting pieces 125*c* respectively insert into the two inserting holes 116*e*, a position of the heat sink frame 12 relative to the shell 11 in the left-right direction D3 and a position of the heat sink frame 12 relative to the shell 11 in the up-down direction D2 can be limited. In addition, by that the positioning latch piece 125*d* cooperates with the positioning latch hole 116*f*, a position of the heat sink frame 12 relative to the shell 11 in the front-rear direction D1 can be positioned, two opened slits 122*a* are formed to the lower wall 122 at a left side and a right side of the positioning latch piece 125*d*, with the two opened slits 122*a*, the positioning latch piece 125*d* can elastically move, so in a process that the heat sink frame 12 is assembled to the shell 11, the positioning latch piece 125*d* can first elastically move upwardly to pass over the top wall 111 from the window 11*c*, and then downwardly restore and downwardly latch into the positioning latch hole 116*f*. The upper wall 121 of the heat sink frame 12 is provided thereon with two strengthening ribs 121*a* which extend along the front-rear direction D1, the inserting piece 125*c* is also provided thereon with a strengthening rib 125*e* which extends along the up-down direction D2.

The heat sink frame 12 further has a heat sink accommodating space 126 which is defined together by the upper wall 121, the lower wall 122, the front connecting wall 123 and the two side walls 124, and a lower portion opening 127 which is communicated with the heat sink accommodating space 126, is formed to the lower wall 122 and corresponds to the window 11*c* of the shell 11. The heat sink module 4 is assembled to the heat sink accommodating space 126 of the heat sink frame 12. The heat sink module 4 includes a movable plate 41, a heat sink 42, a pressure-applying spring 43, a pressure-applying spring acting construction 44, two position-restoring springs 45 and a supporting spring 46. The movable plate 41 is constructed as a thin plate and at least partially covers the heat sink 42, a rear end of the movable plate 41 has a pushed portion 411 which downwardly passes through the lower portion opening 127 and the window 11*c* to enter into the inserting passageway 11*a*. The heat sink 42 is positioned below the movable plate 41, the heat sink 42 has a base plate 421, and a plurality of heat dissipating fins 422 which are arranged side by side with each other along the left-right direction D3 and integrally extend upwardly from a top surface of the base plate 421. The base plate 421 has a penetrating hole 421*a* which allows the pushed portion 411 of the movable plate 41 to pass through, and a thermal coupling portion 421*b* which is positioned a bottom portion of the base plate 421, protrudes downwardly and is used to downwardly pass through the lower portion opening 127 and the window 11*c* to enter into the inserting passageway 11*a*, in the first embodiment, the thermal coupling portion 421*b* has a protruding block 421*c* which protrudes downwardly and a thermal conductive pad 421*d* which is provided to a bottom surface of the protruding block 421*c*, the thermal conductive pad 421*d* for example may be a thermal interface material, the thermal interface material can sufficiently fill seams or gaps of contact surfaces to reduce a contact thermal resistance between the contact surfaces, the thermal interface material may be selected from, for example, a combination of materials with performances, such as high thermal conductivity, high flexibility, compressibility, insulation, abrasion resistance, etc. al, and for example, can be a combination of a substrate and a phase change material, for example, it can be two or more layers configuration, an outer layer substrate of which can be a material with thermal conductivity, lubricity, abrasion resistance and tear resistance (such as Teflon), and an inner layer material of which can be a phase change material. In addition, the thermal interface material may also have an electromagnetic wave shielding effect (EMI Shielding) at the same time by changing a combination of materials.

The movable plate 41 can move relative to the heat sink frame 12 between a first position (see FIG. 6) which is in the front and a second position (see FIG. 8) which is in the rear along the front-rear direction D1. The heat sink 42 can move relative to the heat sink frame 12 between a release position (see FIG. 6) which is in the up and a contact position (see FIG. 8) which is in the down along the up-down direction D2. Specifically, in the first embodiment, the heat sink 42 and the heat sink frame 12 is provided therebetween with a heat sink guiding construction, the heat sink guiding construction includes two guiding holes 124*b* which are constructed on the two side walls 124 of the heat sink frame 12 respectively and two guiding protrusions 423 which are constructed on a left side and a right side of the heat sink 42 respectively, are correspondingly provided to the two guiding holes 124*b* and can move along the up-down direction D2, by that the two guiding protrusions 423 and the two guiding holes 124*b* cooperate with each other, movement of the heat sink 42 in the front-rear direction D1 is limited, and the heat sink 42 can move up and down relative to the heat sink frame 12 between the release position which is in the up and the contact position which is in the down along the up-down direction D2.

The pressure-applying spring 43 is provided between the movable plate 41 and the heat sink 42. In the first embodiment, the pressure-applying spring 43 is integrally constructed on the movable plate 41, the heat sink frame 12 is constructed with the pressure-applying spring acting construction 44. The pressure-applying spring 43 includes a plurality of plate spring portions 431 which are constructed at two sides of the movable plate 41 and are arranged in the front-rear direction, each plate spring portion 431 includes a base portion 431*a* and an elastic arm 431*b* which obliquely extends forwardly and upwardly from the base portion 431*a*, and bottom portions the plurality of plate spring portions 431 downwardly press against the heat sink 42. The pressure-applying spring acting construction 44 includes a plurality of interfering pieces 441 which are constructed on the upper wall 121 of the heat sink frame 12 and protrude downwardly, the plurality of interfering pieces 441 respectively correspond to the plurality of plate spring portions 431.

The two position-restoring springs 45 are provided between the heat sink frame 12 and the movable plate 41, and are used to provide an elastic acting force that the movable plate 41 moves to the first position. The heat sink frame 12 has two first hook portions 128 which are positioned at a front end of the heat sink frame 12, the movable plate 41 has two second hook portions 412 which are positioned at a front end of the movable plate 41, the two position-restoring springs 45 each are a coil spring which extends along the front-rear direction D1, a front end of each position-restoring spring 45 connects the first hook portion 128 and a rear end of each position-restoring spring 45 connects the second hook portion 412.

The supporting spring 46 upwardly and elastically supports the heat sink 42, and is used to provide an elastic acting force that the heat sink 42 moves to the release position. The supporting spring 46 includes two supporting spring constructions 461, the two supporting spring constructions 461 are integrally constructed on the lower wall 122 at a left side and a right side of the lower portion opening 127 of the heat sink frame 12 (close to inner sides of the two side walls 124) respectively and upwardly support the left side and the right side of the heat sink 42 respectively. Each supporting spring construction 461 includes two elastic supporting portions 461*a* which upwardly support the heat sink 42 and are plate-shaped, the two elastic supporting portions 461*a* upwardly and respectively forwardly and rearwardly extend obliquely.

Referring to FIG. 1, FIG. 3 and FIG. 6 to FIG. 9, a cooperating relationship between the pluggable module 3 and the heat sink module 4 is described below.

Figure 6:
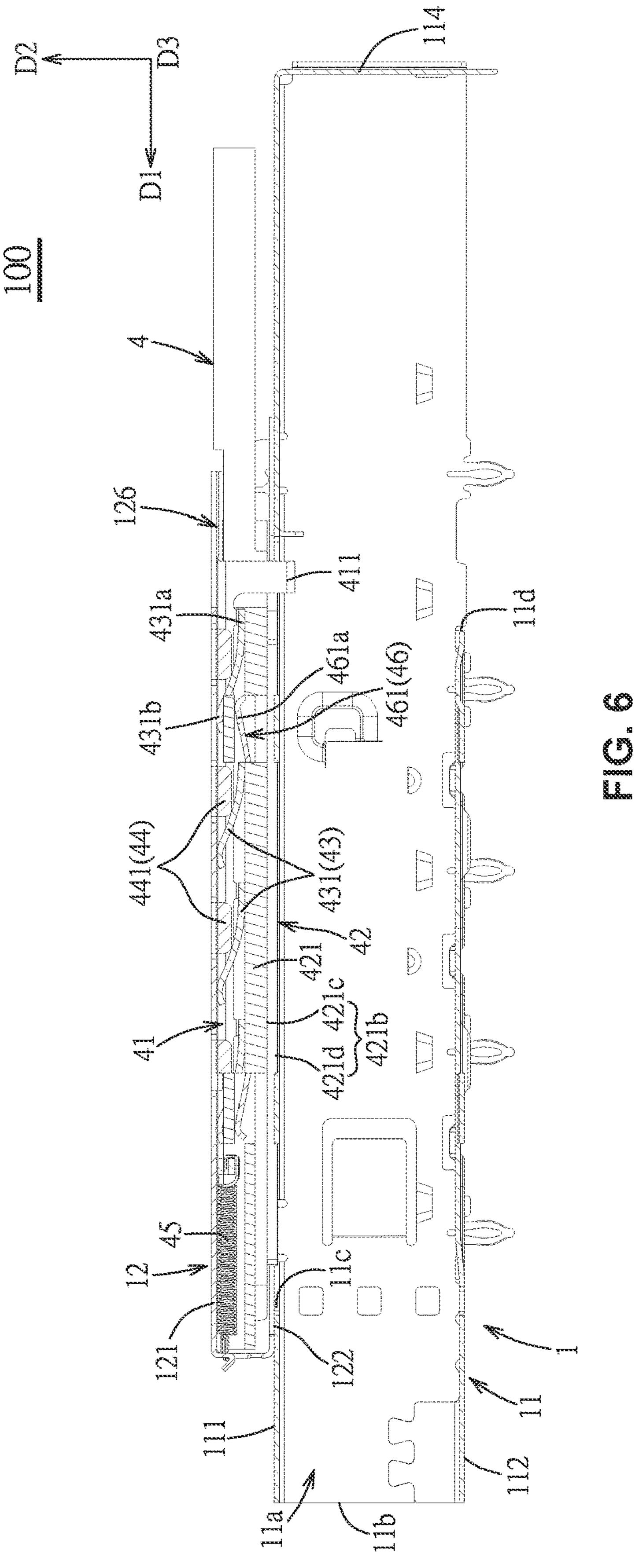
FIG. 6 is a stepped cross sectional view taken along a line A-A of FIG. 5, in which the movable plate of the heat sink module is positioned in the first position, the heat sink of the heat sink module is positioned in the release position, interfering pieces of a pressure-applying spring acting construction of the heat sink module are respectively positioned behind plate spring portions of a pressure-applying spring, a supporting spring of the heat sink module upwardly supports the heat sink in the release position, and a receptacle connector is omitted.

As shown in FIG. 6, before the pluggable module 3 does not insert into the inserting passageway 11*a* of the cage 1, the movable plate 41 is positioned in the first position due to the elastic acting force provided by the two position-restoring springs 45. In the first position, the heat sink 42 is positioned in the release position due to the elastic acting force provided by the supporting spring 46. At this time, the interfering pieces 441 of the pressure-applying spring acting construction 44 which are constructed to the heat sink frame 12 are respectively positioned behind the plate spring portions 431 of the pressure-applying spring 43 which are constructed to the movable plate 41. In addition, in an embodiment, the interfering pieces 441 of the pressure-applying spring acting construction 44 which are constructed to the heat sink frame 12 also may forwardly act to the plate spring portions 431 of the pressure-applying spring 43 which are constructed to the movable plate 41 and is in form of oblique-shape, therefore, by the action between the pressure-applying spring acting construction 44 and the pressure-applying spring 43, the movable plate 41 would also be held in the first position.

Figure 7:
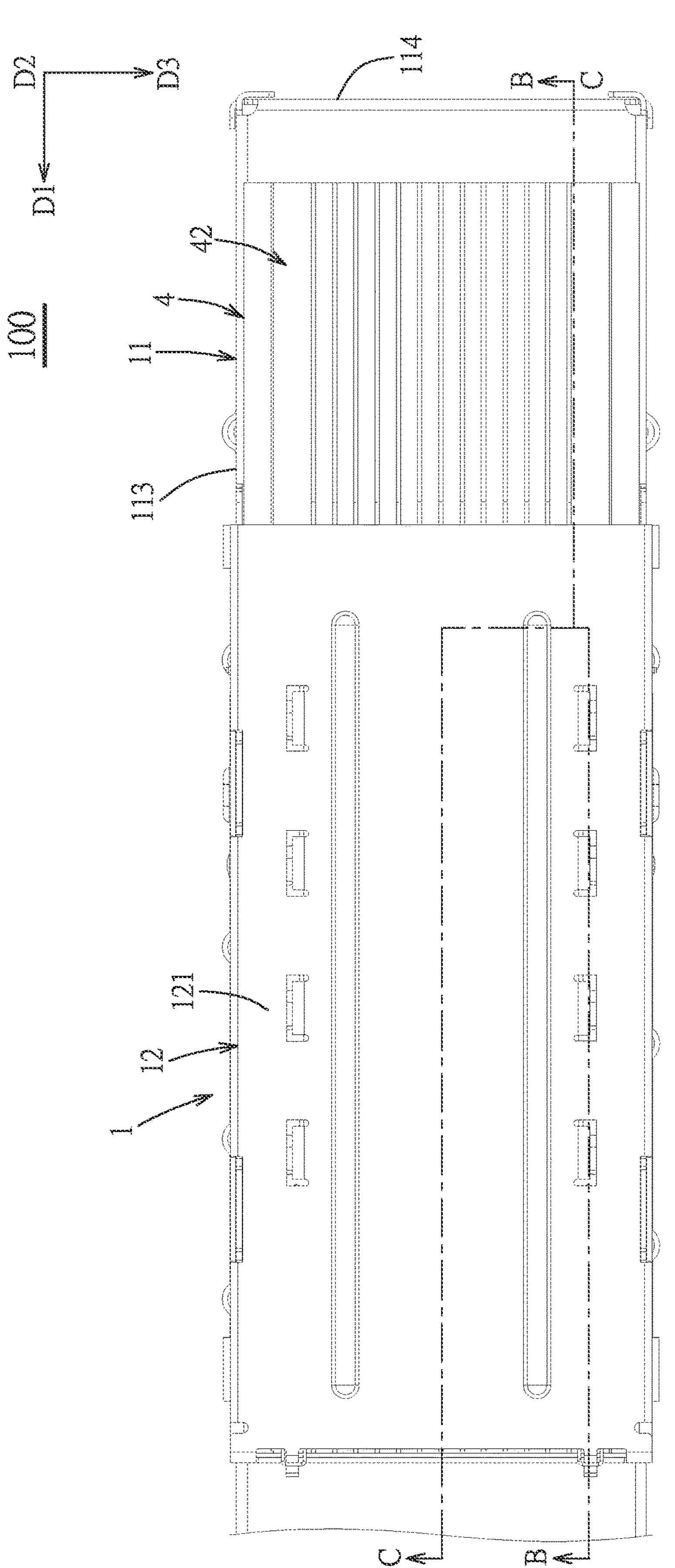
FIG. 7 is a top view of the first embodiment, in which the pluggable module inserts into the inserting passageway of the cage.
Figure 8:
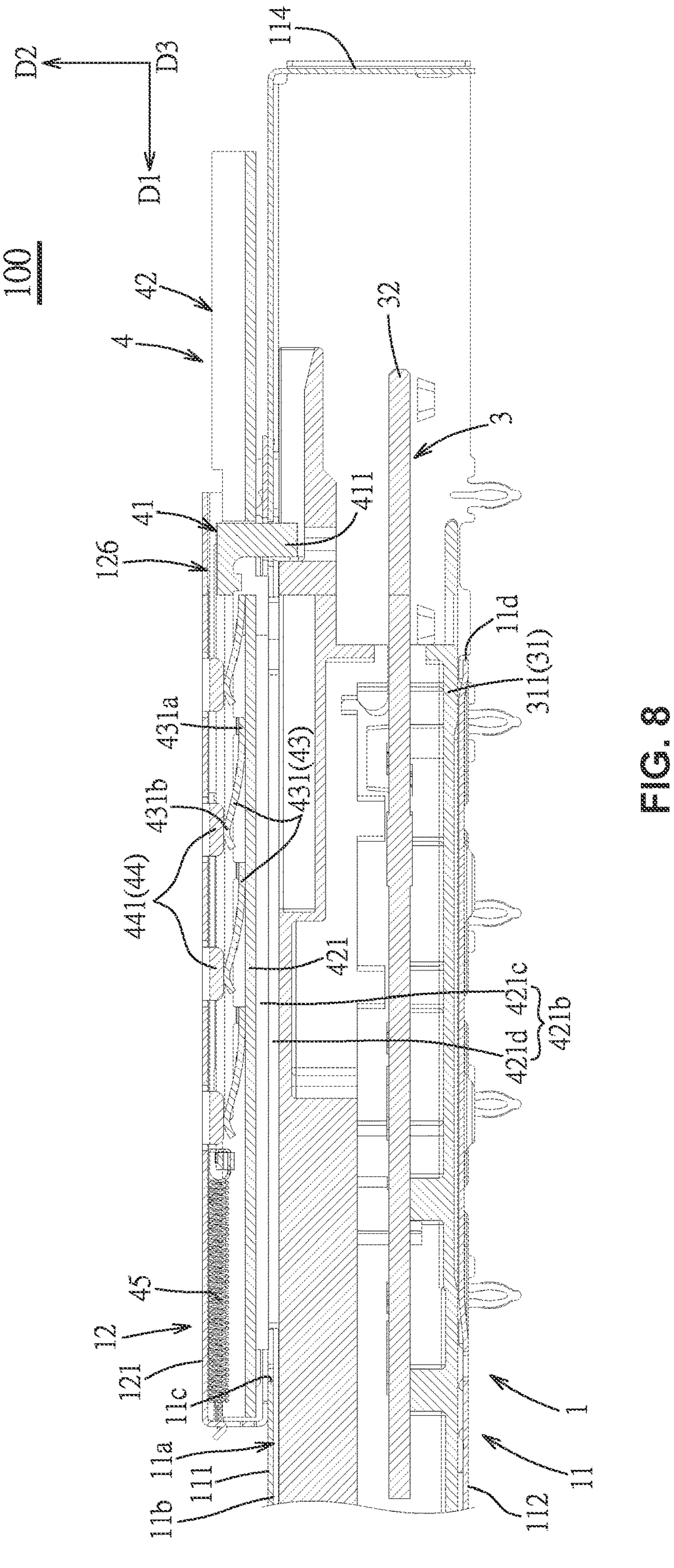
FIG. 8 is a stepped cross sectional view taken along a line B-B of FIG. 7, in which the pluggable module inserts into the inserting passageway of the cage, the movable plate of the heat sink module is positioned in a second position, the heat sink of the heat sink module is positioned in a contact position, the interfering pieces of the pressure-applying spring acting construction of the heat sink module respectively act downwardly to the plate spring portions of the pressure-applying spring, the position-restoring springs are stretched, and the receptacle connector is omitted.
Figure 9:
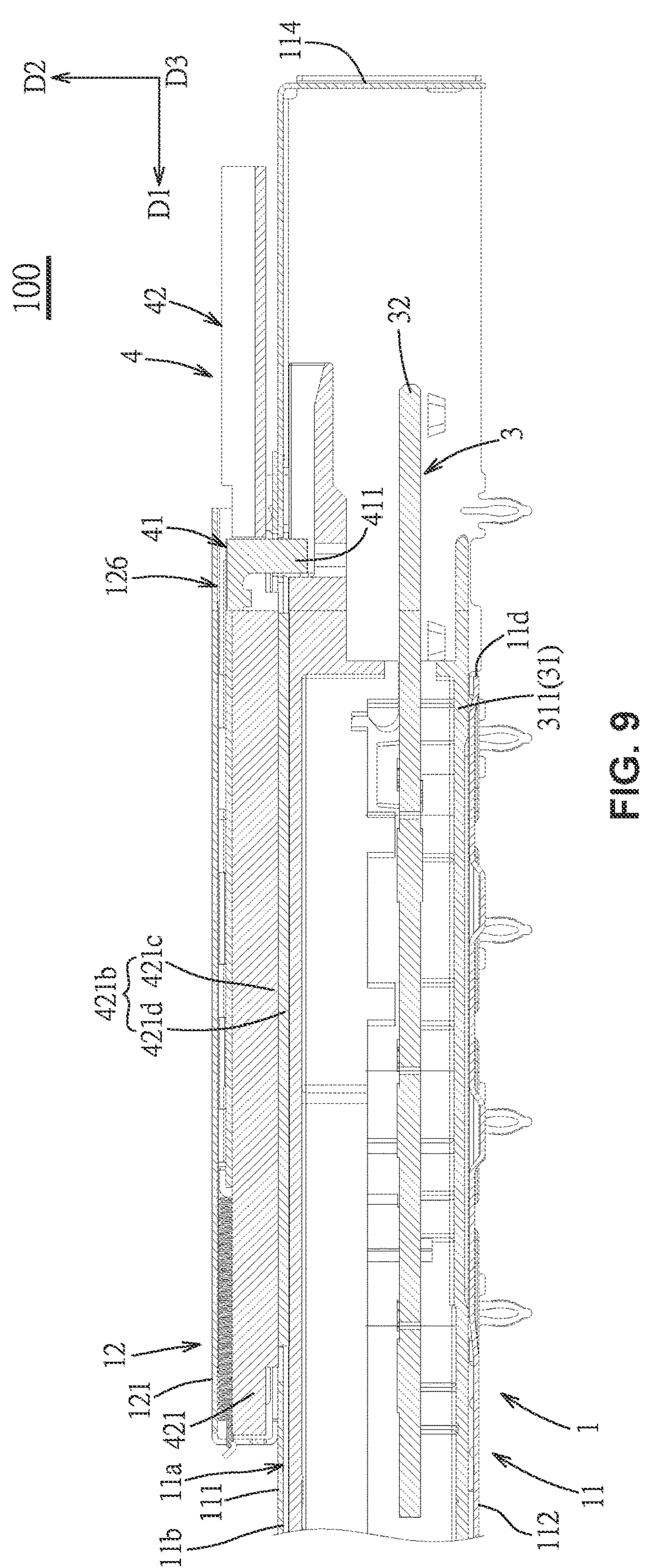
FIG. 9 is another stepped cross sectional view along taken along a line C-C of FIG. 7, in which the pluggable module inserts into the inserting passageway of the cage, the movable plate of the heat sink module is positioned in the second position, the heat sink of the heat sink module is positioned in the contact position and downwardly contacts s surface of the pluggable module, and the receptacle connector is omitted.
Figure 10:
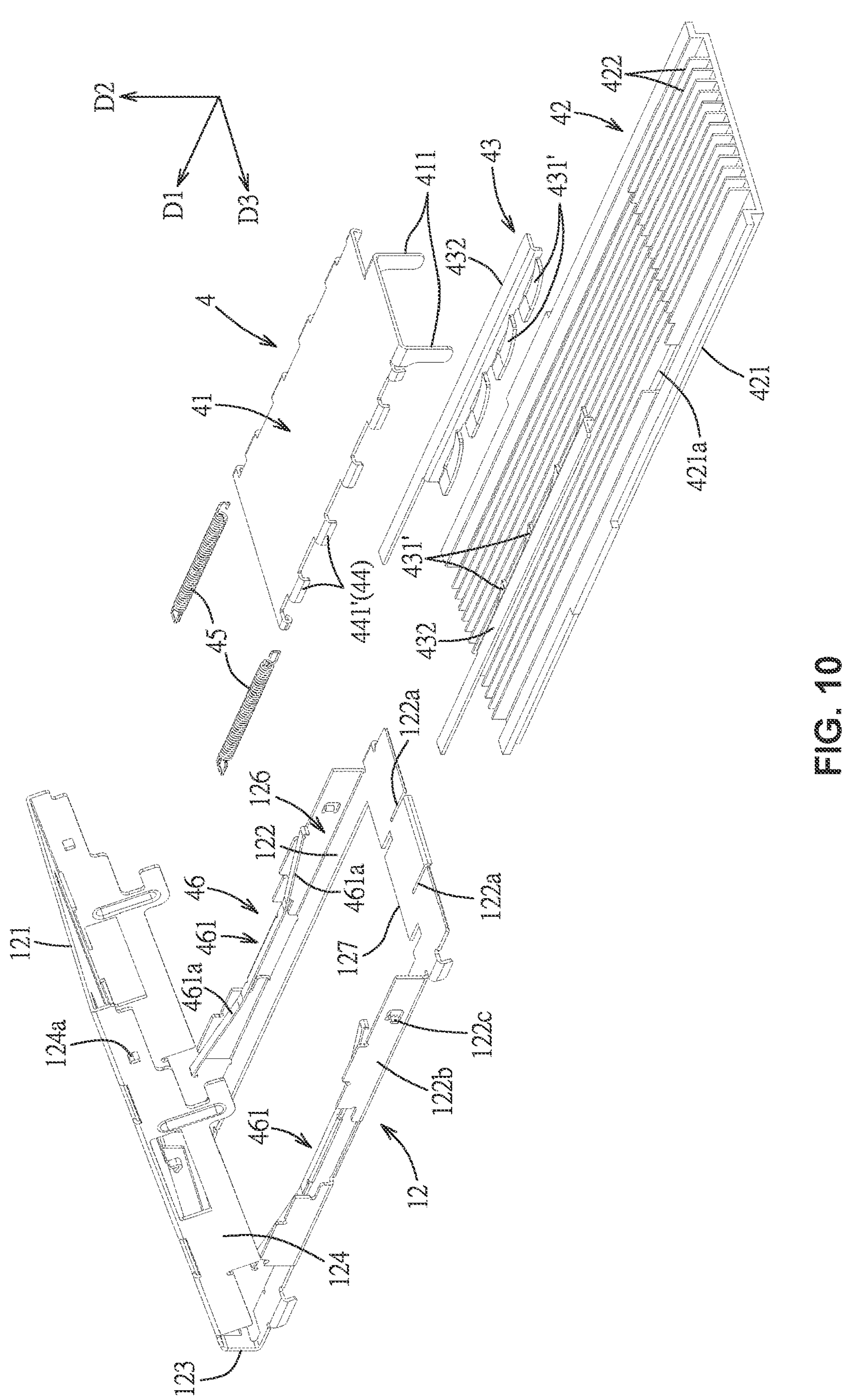
FIG. 10 is a perspective exploded view of a heat sink frame and a heat sink module of a second embodiment of the connector assembly of the present disclosure.
Figure 11:
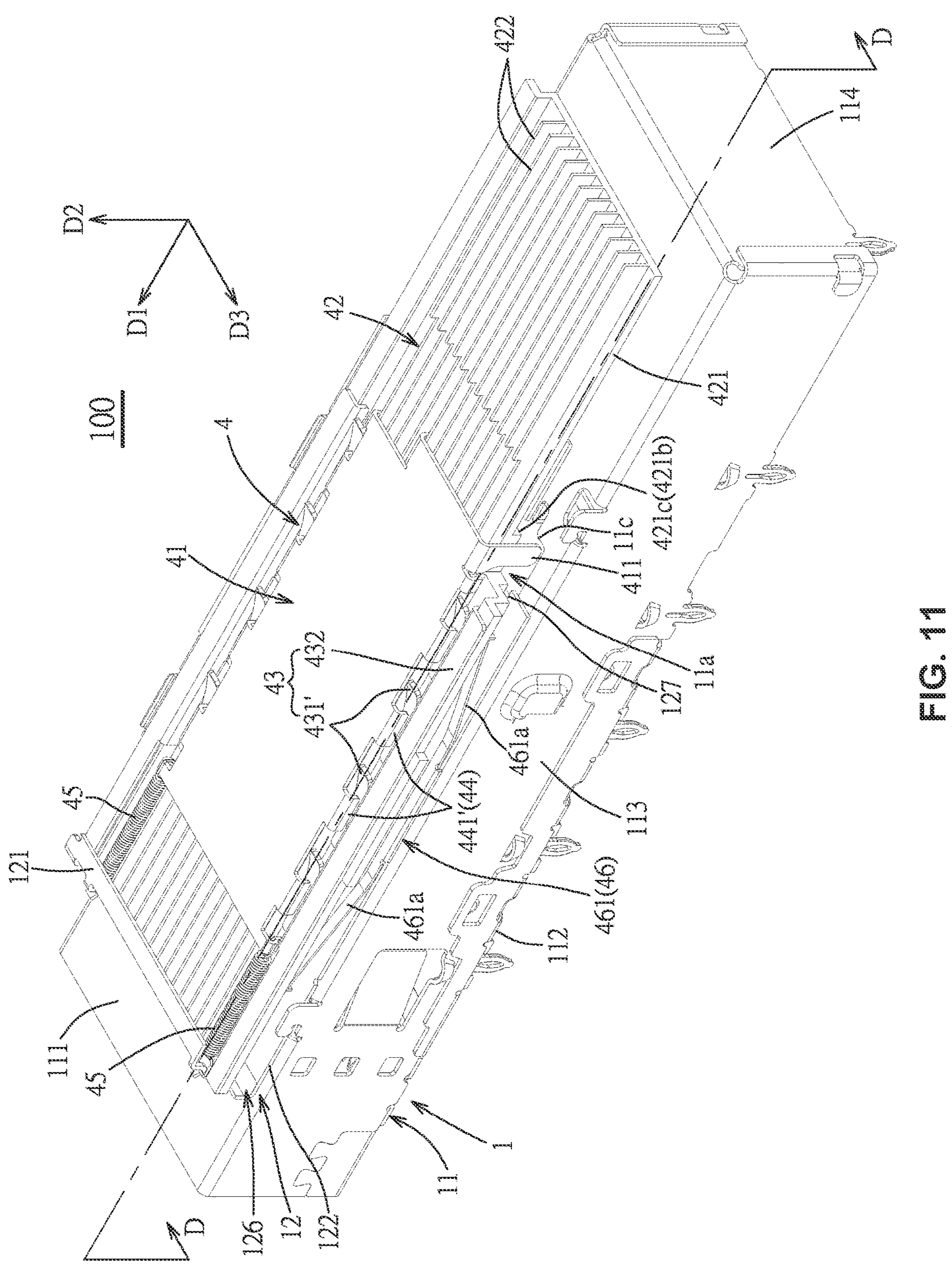
FIG. 11 is a partially cut perspective view of the second embodiment, in which a movable plate of the heat sink module is positioned in the first position and a heat sink of the heat sink module is positioned in the release position.

As shown in FIG. 7 to FIG. 9, when the pluggable module 3 inserts into the inserting passageway 11*a* of the cage 1 along the inserting direction which is from front to rear, the pluggable module 3 will rearwardly push the pushed portion 411 of the movable plate 41, and make the movable plate 41 rearwardly move from the first position to the second position, at this time, the plate spring portions 431 of the movable plates 41 of the pressure-applying spring 43 is downwardly acted by the interfering pieces 441 of the pressure-applying spring acting construction 44 of the heat sink frame 12 respectively, so that the movable plate 41 contains a downward movement besides a rearward movement, and in turn the plate spring portions 431 of the pressure-applying spring 43 of the movable plate 41 bring the heat sink 42 to downwardly move from the release position so as to move to the contact position, the elastic acting force of the pressure-applying spring 43 makes the thermal coupling portion 421*b* on a bottom portion of the heat sink 42 downwardly contact a surface of the inserting portion 311 of the pluggable module 3 with a pressure, and in this state, a force that the plate spring portions 431 of the pressure-applying spring 43 downwardly push the heat sink 42 is more than a force that the supporting spring 46 upwardly supports the heat sink 42, the supporting spring 46 is compressed and provides the elastic acting force which is used to drive the heat sink 42 to restore to the release position later, and the two position-restoring springs 45 are stretched and provide the elastic acting force which is used to drive the movable plate 41 forwardly restore to the first position later.

When the pluggable module 3 withdraws from the inserting passageway 11*a*, the elastic acting force provided by the supporting spring 46 upwardly raises the heat sink 42 to move to the release position where the heat sink 42 does not contact the surface of the pluggable module 3, interfering pieces 441 of the pressure-applying spring acting construction 44 of the heat sink frame 12 also will forwardly act to the plate spring portions 431 of the pressure-applying spring 43 which are constructed to the movable plate 41, the pressure-applying spring 43 actuates the movable plate 41 to move forwardly, and the elastic acting force provided by the two position-restoring springs 45 makes the movable plate 41 forwardly move and restore to the first position.

It is noted that, when the heat sink 42 is in the release position, the thermal coupling portion 421*b* on the bottom portion of the heat sink 42 may be as that the first embodiment does not enter into the inserting passageway 11*a*, or also may be positioned in height as that the thermal coupling portion 421*b* enters into the inserting passageway 11*a* but is positioned so that the thermal coupling portion 421*b* does not contact an upper surface of the pluggable module 3, so before the pluggable module 3 pushes the movable plate 41, there is a gap between the thermal coupling portion 421*b* on the bottom portion of the heat sink 42 and the upper surface of the pluggable module 3.

Referring to FIG. 10 to FIG. 13, a second embodiment of the connector assembly 100 of the present disclosure differs from the first embodiment in that, the pressure-applying spring 43 and the movable plate 41 are separated components, the pressure-applying spring 43 is assembled on the heat sink 42, the pressure-applying spring 43 includes two fixing portions 432 which extend along the front-rear direction D1 and are assembled to two sides of the heat sink 42 respectively by using for example a welding or latching manner, and a plurality of plate spring portions 431' which are integrally constructed on the two fixing portions 432 and are arranged in the front-rear direction, the plurality of plate spring portions 431' of the pressure-applying spring 43 obliquely extend rearwardly and upwardly. The movable plate 41 is constructed with the pressure-applying spring acting construction 44, the pressure-applying spring acting construction 44 includes a plurality of interfering pieces 441' which are constructed to two sides of the movable plate 41 and protrude downwardly. In the second embodiment, the movable plate 41 is limited between the heat sink 42 and the heat sink frame 12, so the movable plate 41 is basically translated rearwardly from the first position to the second position.

Figure 12:
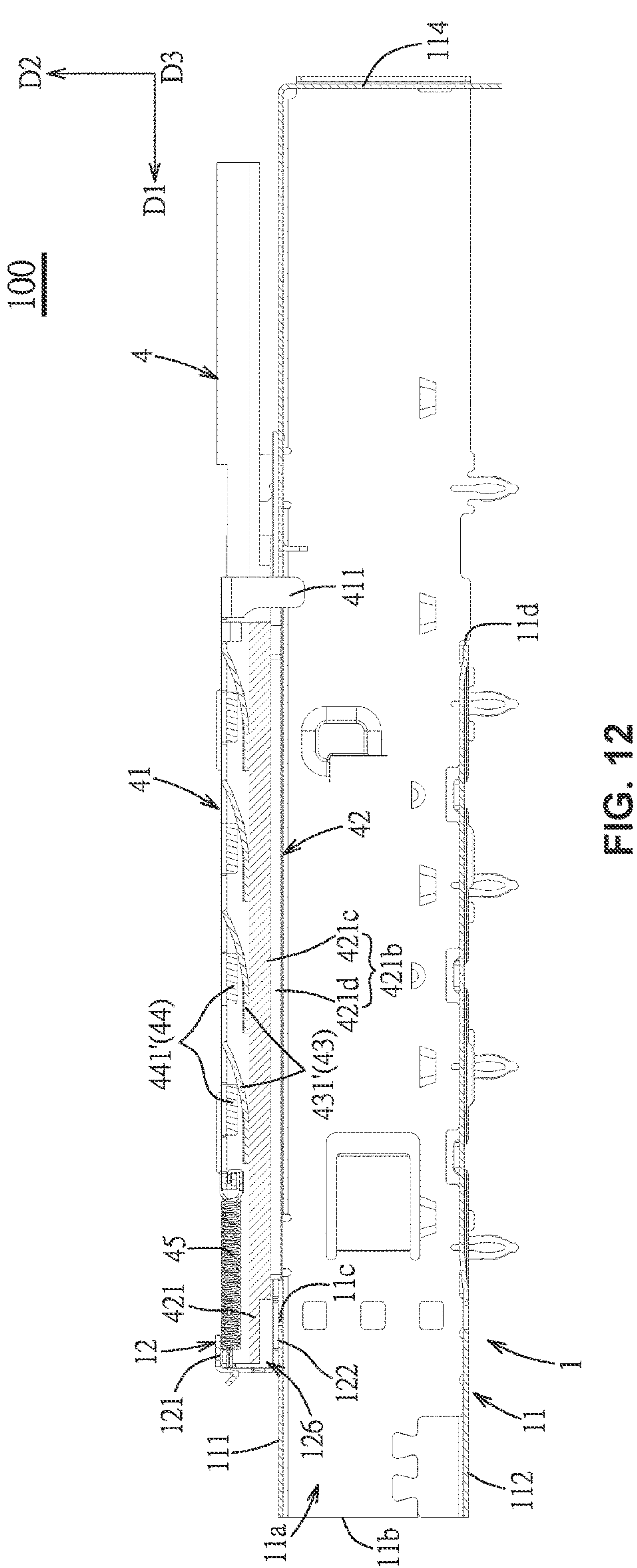
FIG. 12 is a cross sectional view taken along a line D-D of FIG. 11, in which the movable plate of the heat sink module is positioned in the first position and the heat sink of the heat sink module is positioned in the release position, and the receptacle connector is omitted.
Figure 13:
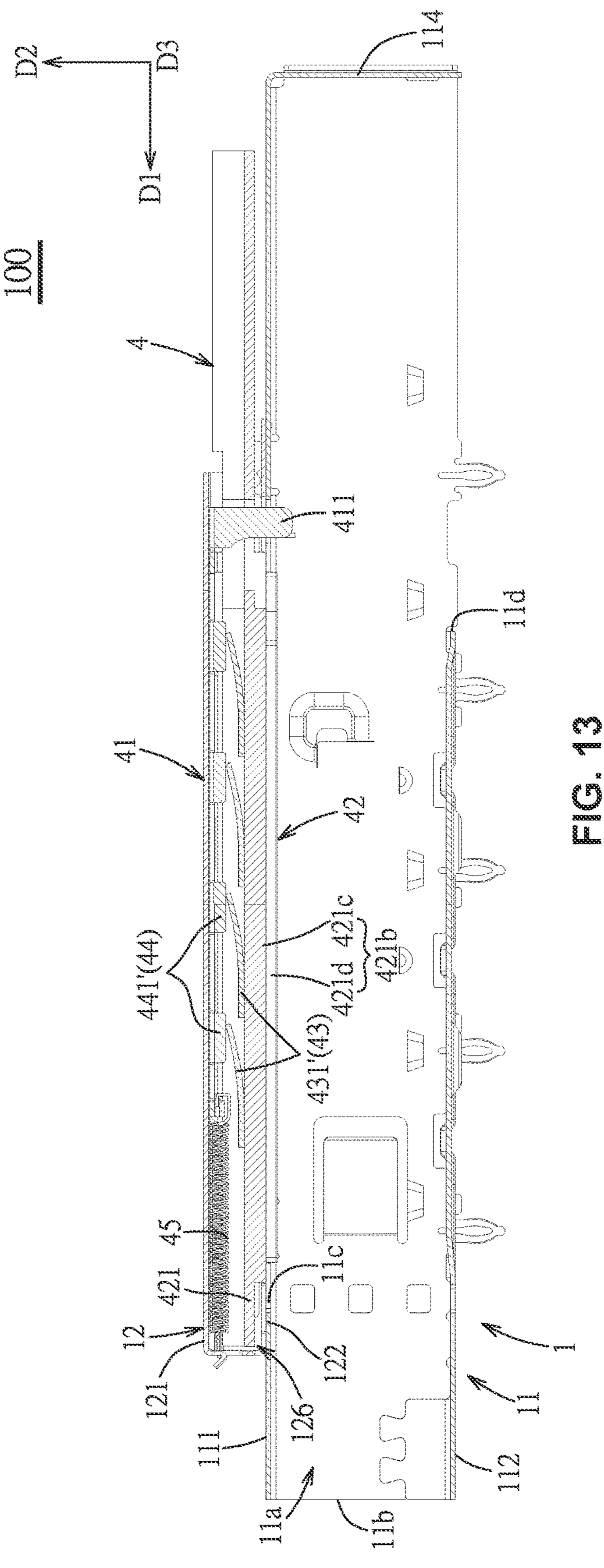
FIG. 13 is a stepped cross sectional view similar to FIG. 12, in which the movable plate of the heat sink module is positioned in the second position and the heat sink of the heat sink module is positioned in the contact position, and the receptacle connector and the pluggable module are omitted.
Figure 14:
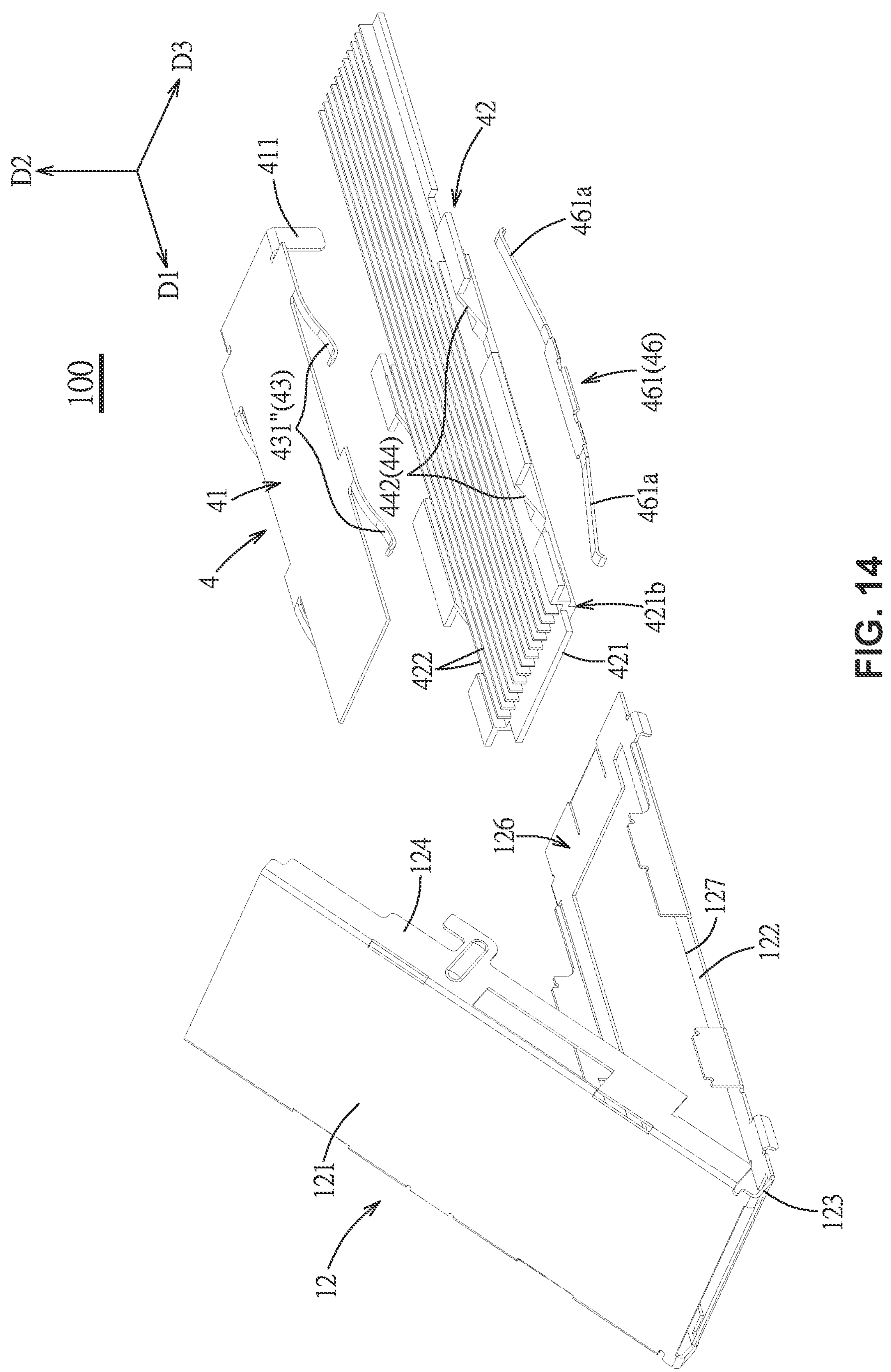
FIG. 14 is a perspective exploded view of a heat sink frame and a heat sink module of a third embodiment of the connector assembly of the present disclosure.

As shown in FIG. 12, when the movable plate 41 is positioned in the first position, the heat sink 42 is positioned in the release position due to the elastic acting force provided by the supporting spring 46, the interfering pieces 441' of the pressure-applying spring acting construction 44 which are constructed on the movable plate 41 are respectively positioned in front of the plate spring portions 431' of the pressure-applying spring 43 which are assembled to the heat sink 42. As shown in FIG. 13, when the movable plate 41 is subjected to a pushing force from the pluggable module 3 (see FIG. 1) to rearwardly move from the first position to the second position, the interfering pieces 441' of the pressure-applying spring acting construction 44 which are constructed on the movable plate 41 downwardly act to the plate spring portions 431' of the pressure-applying spring 43 which are assembled to the heat sink 42, in turn make the pressure-applying spring 43 bring the heat sink 42 to move downwardly from the release position and move to the contact position. It is noted that, when the pluggable module 3 withdraws from the inserting passageway 11*a*, the plate spring portions 431' of the pressure-applying spring 43 which are assembled to the heat sink 42 and are in form of oblique-shape also will forwardly act to the interfering pieces 441' of the pressure-applying spring acting construction 44 which are constructed to the movable plate 41, so, the action between the pressure-applying spring acting construction 44 and the pressure-applying spring 43 makes the movable plate 41 forwardly move, and the elastic acting force provided by the two position-restoring springs 45 makes the movable plate 41 forwardly move and restore to the first position.

In addition, in the second embodiment, the two supporting spring constructions 461 of the supporting spring 46 are in form of independent element and are assembled to the heat sink frame 12 by using for example a welding or latching manner. Moreover, it is noted that, the two side walls 124 of the heat sink frame 12 are respectively assembled to two side assembling portions 122*b* of the lower wall 122 which extend upwardly, each side wall 124 has a latching hole 124*a*, each side assembling portion 122*b* of the lower wall 122 has a latching piece 122*c* which is assembled to the latching hole 124*a* of the corresponding side wall 124.

Referring to FIG. 14 to FIG. 18, a third embodiment of the connector assembly 100 of the present disclosure differs from the first embodiment in that, the pressure-applying spring 43 which is integrally constructed on the movable plate 41 includes a plurality of plate spring portions 431" which are constructed to the two sides of the movable plate 41 and are arranged in the front-rear direction, the plurality of plate spring portions 431" of the pressure-applying spring 43 extend forwardly and downwardly. The heat sink 42 is constructed with the pressure-applying spring acting construction 44, the pressure-applying spring acting construction 44 includes a plurality of interfering oblique surfaces 442 which are constructed to the two sides of the heat sink 42 and obliquely extend rearwardly and upwardly, the plurality of interfering oblique surfaces 442 respectively correspond to the plurality of plate spring portions 431". In the third embodiment, the movable plate 41 is basically translated rearwardly from the first position to the second position.

Figure 15:
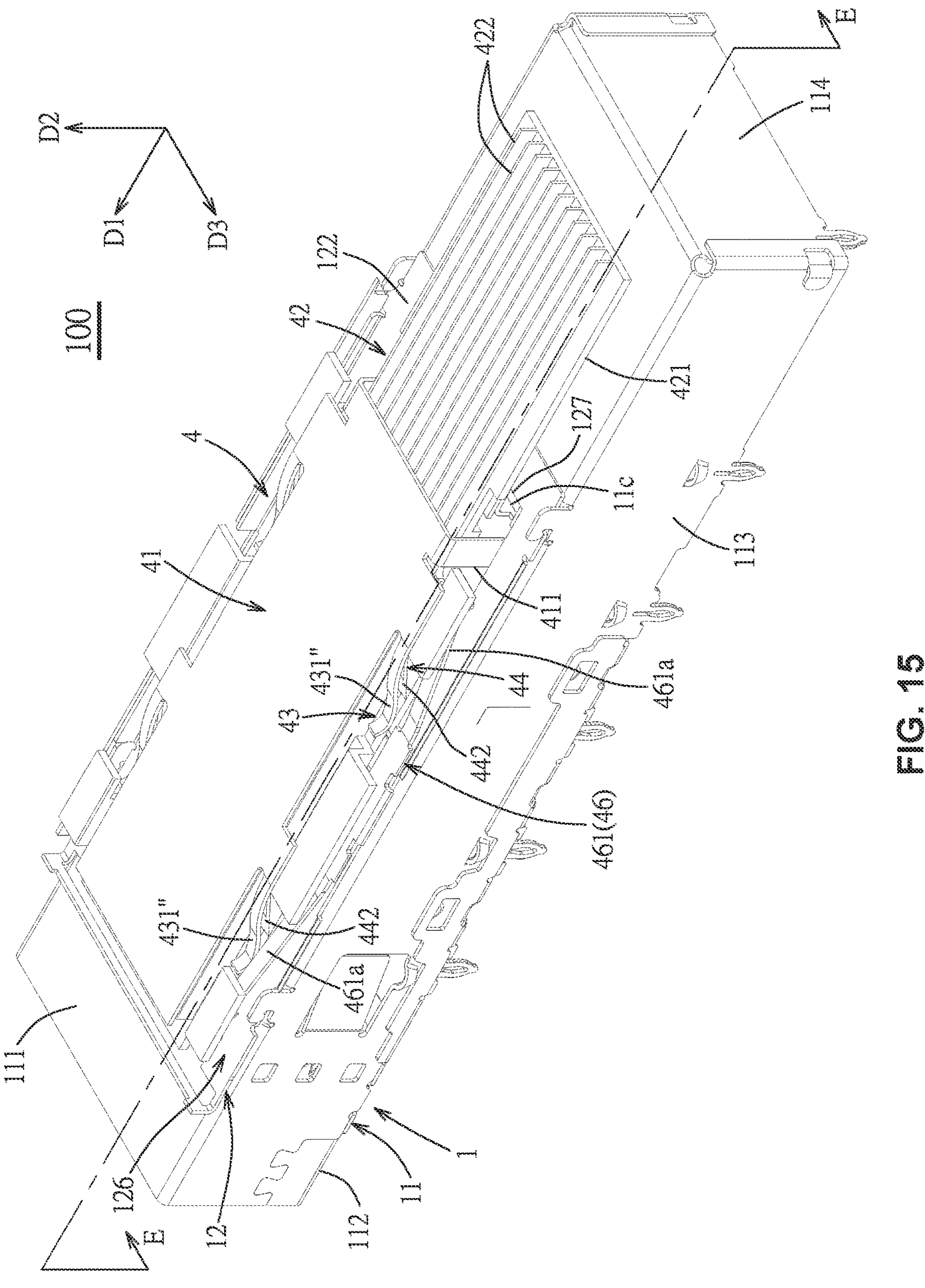
FIG. 15 is a partially cut perspective view of the third embodiment, in which a movable plate of the heat sink module is positioned in the first position and a heat sink of the heat sink module is positioned in the release position.
Figure 16:
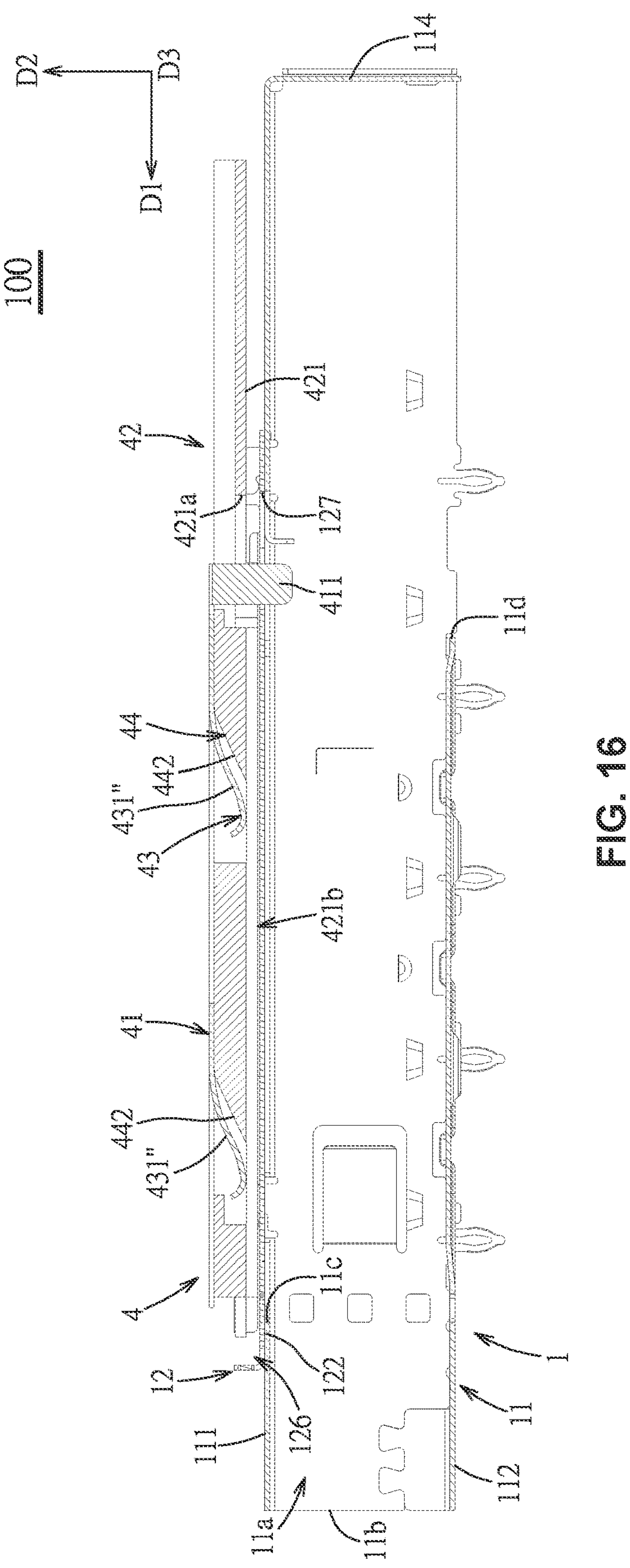
FIG. 16 is a stepped cross sectional view taken along a line E-E of FIG. 15, in which the movable plate of the heat sink module is positioned in the first position and the heat sink of the heat sink module is positioned in the release position, and the receptacle connector is omitted.
Figure 17:
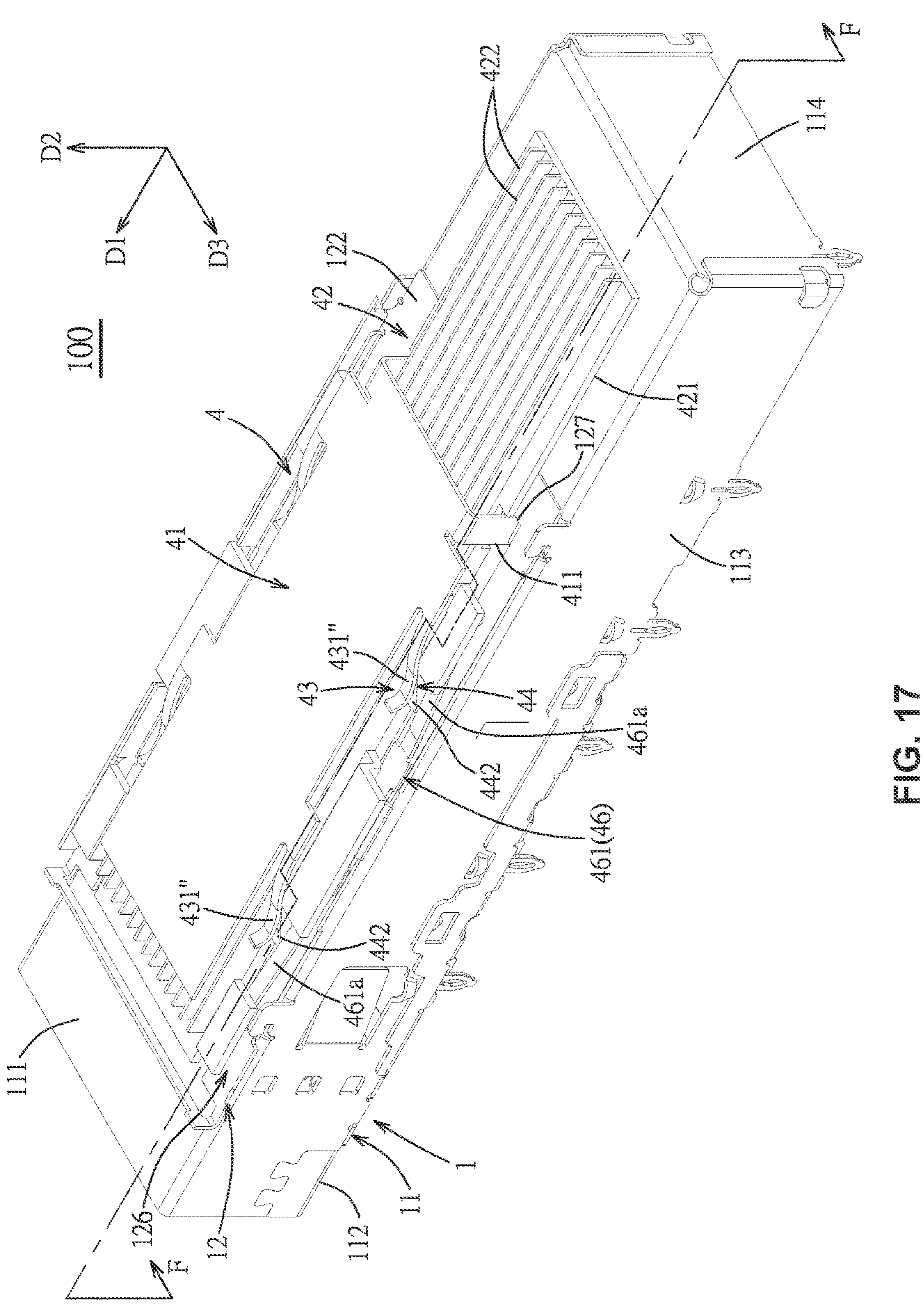
FIG. 17 is a partially cut perspective view of the third embodiment, in which the movable plate of the heat sink module is positioned in the second position and the heat sink of the heat sink module is positioned in the contact position, in which the pluggable module is omitted.
Figure 18:
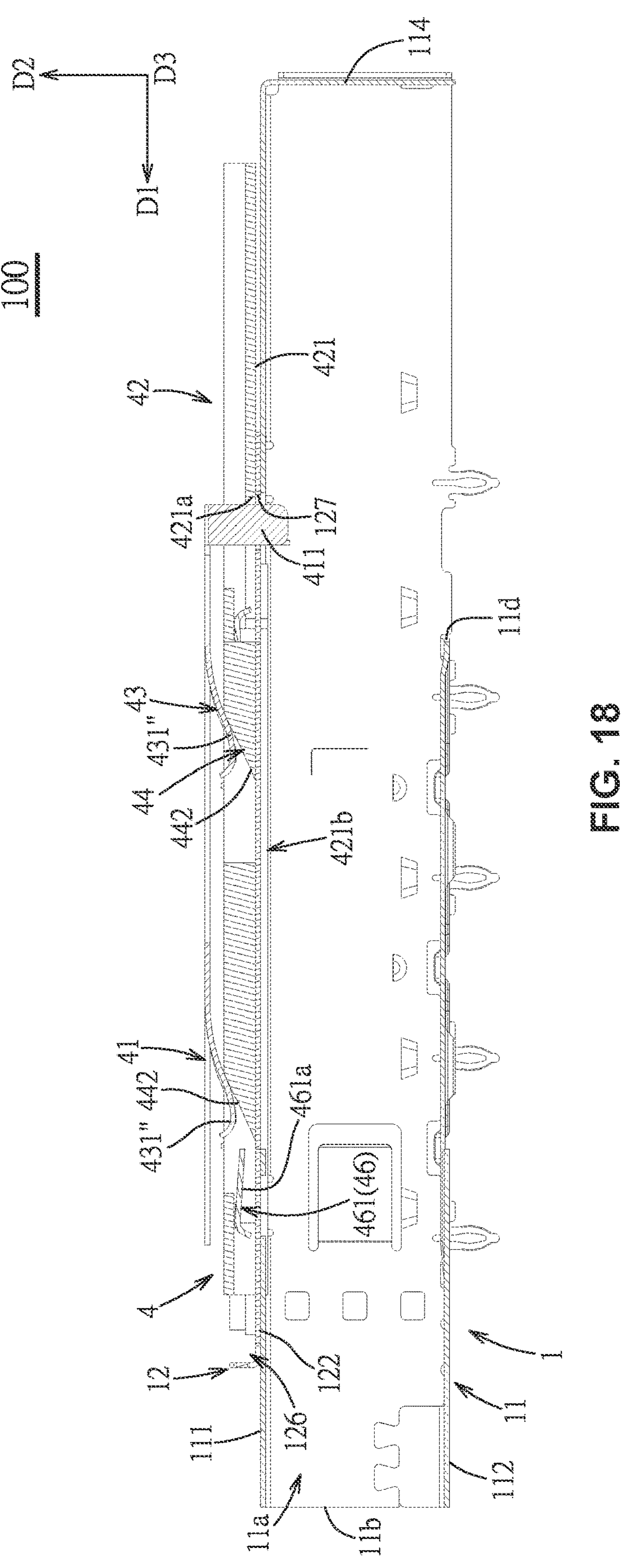
FIG. 18 is a stepped cross sectional view taken along a line F-F of FIG. 17, in which the movable plate of the heat sink module is positioned in the second position and the heat sink of the heat sink module is positioned in the contact position, and the receptacle connector and the pluggable module are omitted.
Figure 19:
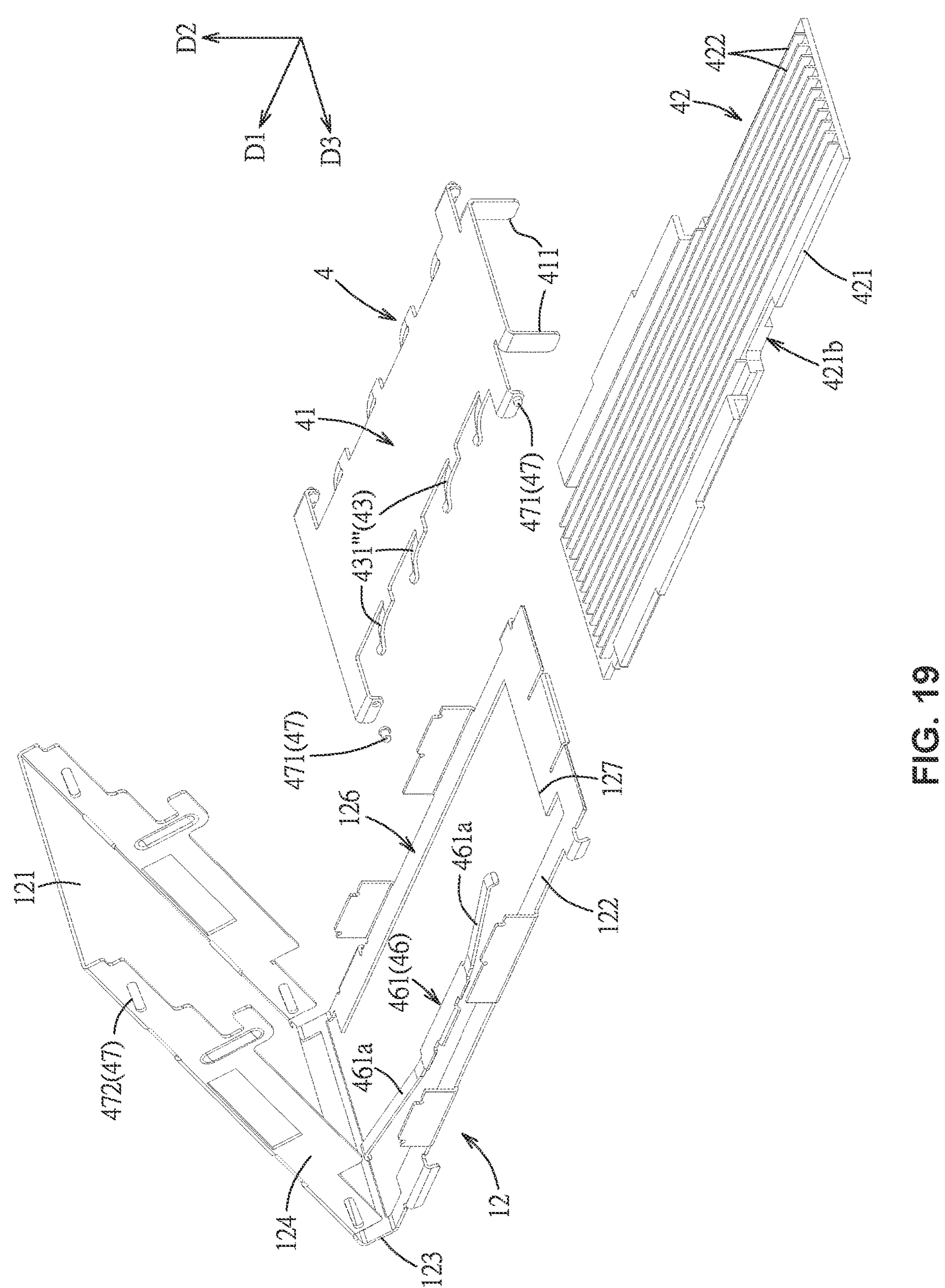
FIG. 19 is a perspective exploded view of a heat sink frame and a heat sink module of a fourth embodiment of the connector assembly of the present disclosure.

As shown in FIG. 15 and FIG. 16, when the movable plate 41 is positioned in the first position, the heat sink 42 is positioned in the release position due to the elastic acting force provided by the supporting spring 46, the interfering oblique surfaces 442 of the pressure-applying spring acting construction 44 which are constructed on the heat sink 42 are respectively positioned behind the plate spring portions 431" of the pressure-applying spring 43 which are constructed on the movable plate 41. As shown in FIG. 17 and FIG. 18, when the movable plate 41 is subjected to the pushing force from the pluggable module 3 (see FIG. 1) to rearwardly move from the first position to the second position, the plate spring portions 431" of the pressure-applying spring 43 which are constructed on the movable plate 41 downwardly act to the interfering oblique surfaces 442 of the pressure-applying spring acting construction 44 which are constructed on the heat sink 42, in turn bring the heat sink 42 to move downwardly from the release position and move to the contact position. When the pluggable module 3 withdraws from the inserting passageway 11*a*, the interfering oblique surfaces 442 of the pressure-applying spring acting construction 44 which are constructed to the heat sink 42 and are in form of oblique-shape will forwardly act to the plate spring portions 431" of the pressure-applying spring 43 which are constructed to the movable plate 41 and are in form of oblique-shape, so the action between the pressure-applying spring acting construction 44 and the pressure-applying spring 43 will make the movable plate 41 move and restore to the first position.

In addition, in the third embodiment, the two supporting spring constructions 461 of the supporting spring 46 are in form of independent element and are assembled to the heat sink frame 12 by using for example a welding or latching manner.

Referring to FIG. 19 to FIG. 23, a fourth embodiment of the connector assembly 100 of the present disclosure differs from the third embodiment in that, the heat sink module 4 further includes a movable plate guiding construction 47, the movable plate 41 can move relative to the heat sink frame 12 between the first position which is in the front and in the up and the second position which is in the rear and in the down under guiding of the movable plate guiding construction 47. The movable plate guiding construction 47 includes a plurality of guiding members 471 and a plurality of guiding grooves 472 which cooperate with each other, the plurality of guiding grooves 472 are constructed on the two side walls 124 of the heat sink frame 12 and obliquely extend rearwardly and downwardly, the plurality of guiding members 471 are constructed on side edges of the movable plate 41 by an assembling manner, for example riveting, and are respectively assembled into the plurality of guiding grooves 472, the movable plate 41 can move along the plurality of guiding grooves 472 with the plurality of guiding members 471.

In addition, in the fourth embodiment, the plurality of plate spring portions 431''' of the pressure-applying spring 43 which are integrally constructed on the movable plate 41 are used to directly act to the two sides of the heat sink 42.

Figure 20:
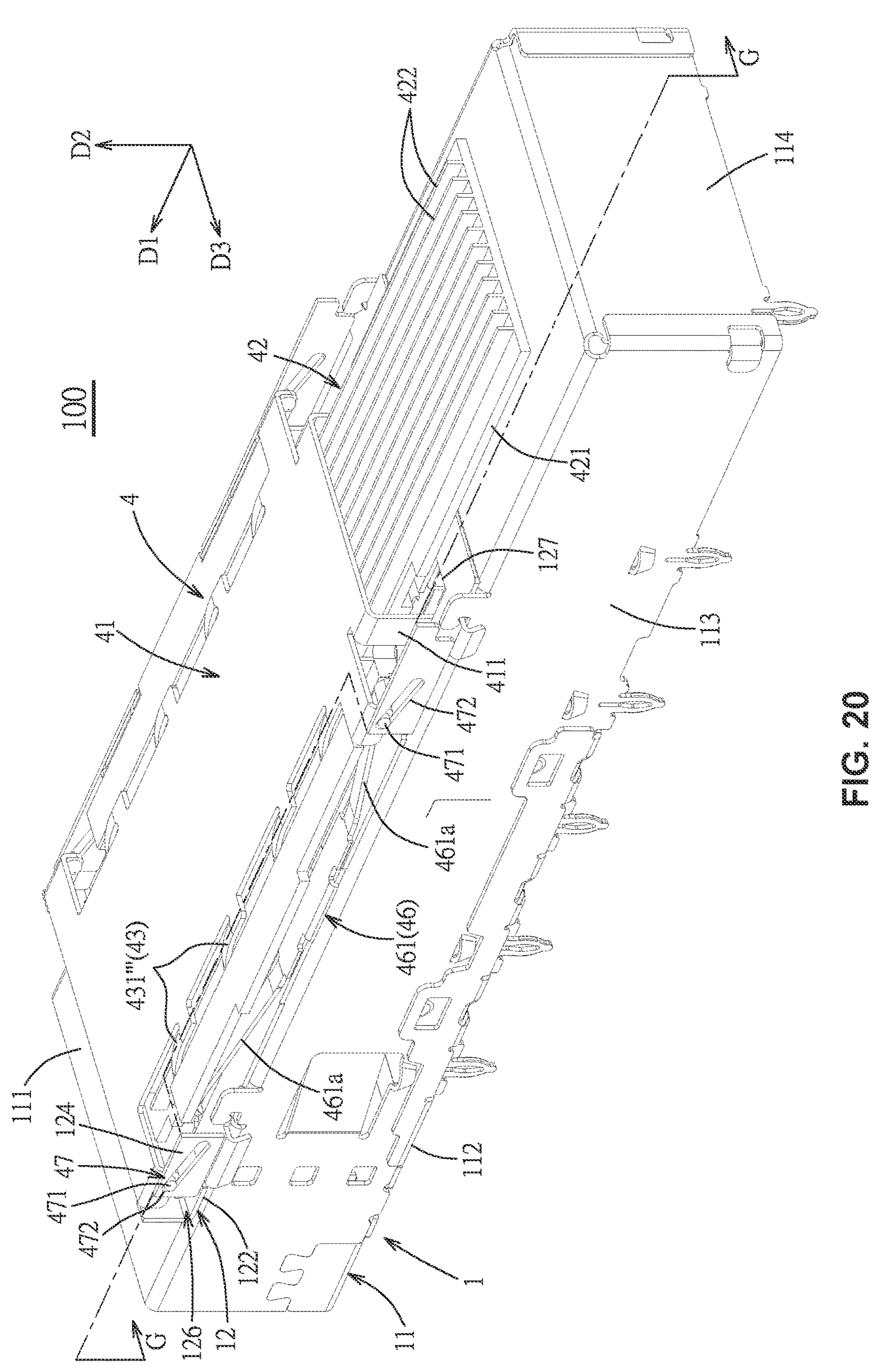
FIG. 20 is a partially cut perspective view of the fourth embodiment, in which a movable plate of the heat sink module is positioned in the first position and a heat sink of the heat sink module is positioned in the release position.
Figure 21:
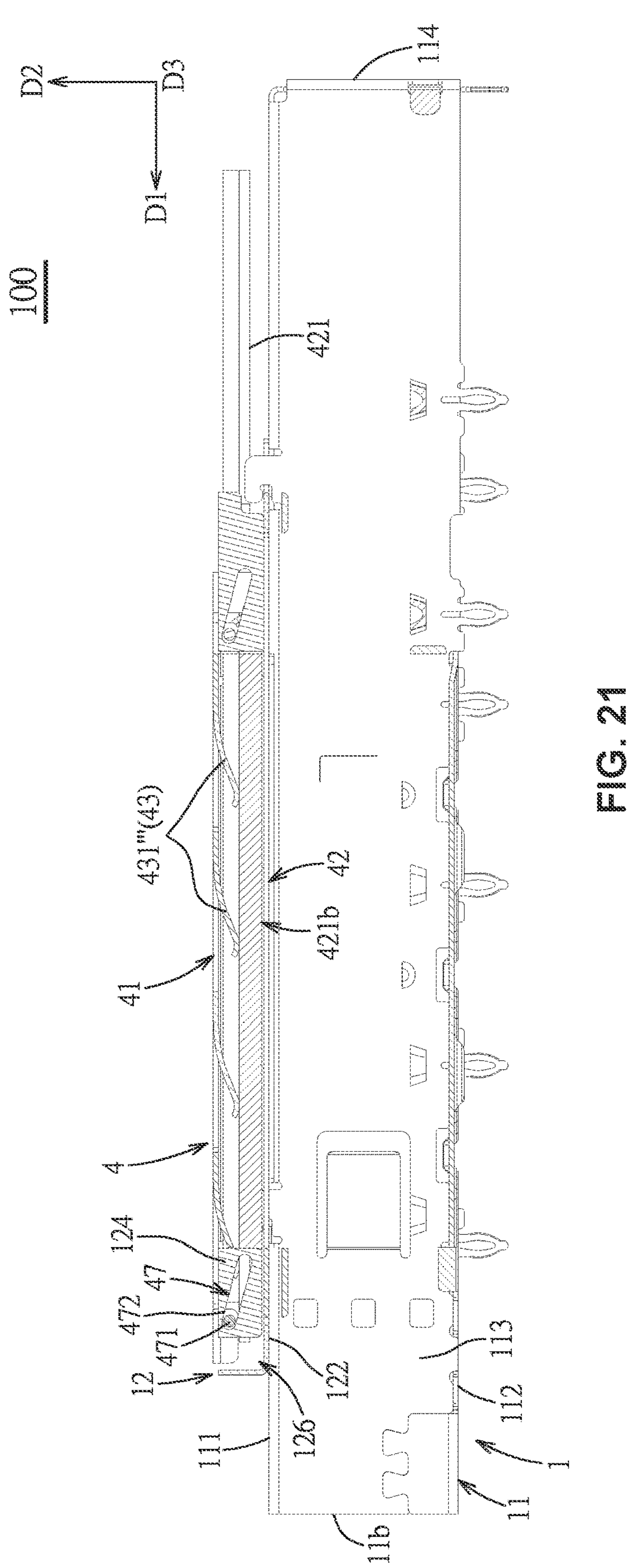
FIG. 21 is a stepped cross sectional view taken along a line G-G of FIG. 20, in which the movable plate of the heat sink module is positioned in the first position and the heat sink of the heat sink module is positioned in the release position, and the receptacle connector is omitted.

As shown in FIG. 20 to FIG. 21, when the movable plate 41 is positioned in the first position, the action force that the plate spring portions 431''' of the pressure-applying spring 43 which are constructed on the movable plate 41 downwardly act to the heat sink 42 is less than the action force that the two supporting spring constructions 461 of the supporting spring 46 upwardly act to the heat sink 42, so the heat sink 42 is positioned in the release position which is in the up. It is noted that, when the movable plate 41 is positioned in the first position, although at this time the plate spring portions 431''' of the pressure-applying spring 43 which are constructed on the movable plate 41 still contact and act to the heat sink 42, but in other implementing manners, at this time the plate spring portions 431''' of the pressure-applying spring 43 which are constructed on the movable plate 41 also may not contact and may not act to the heat sink 42, so the present disclosure is not limited to the fourth embodiment.

Figure 22:
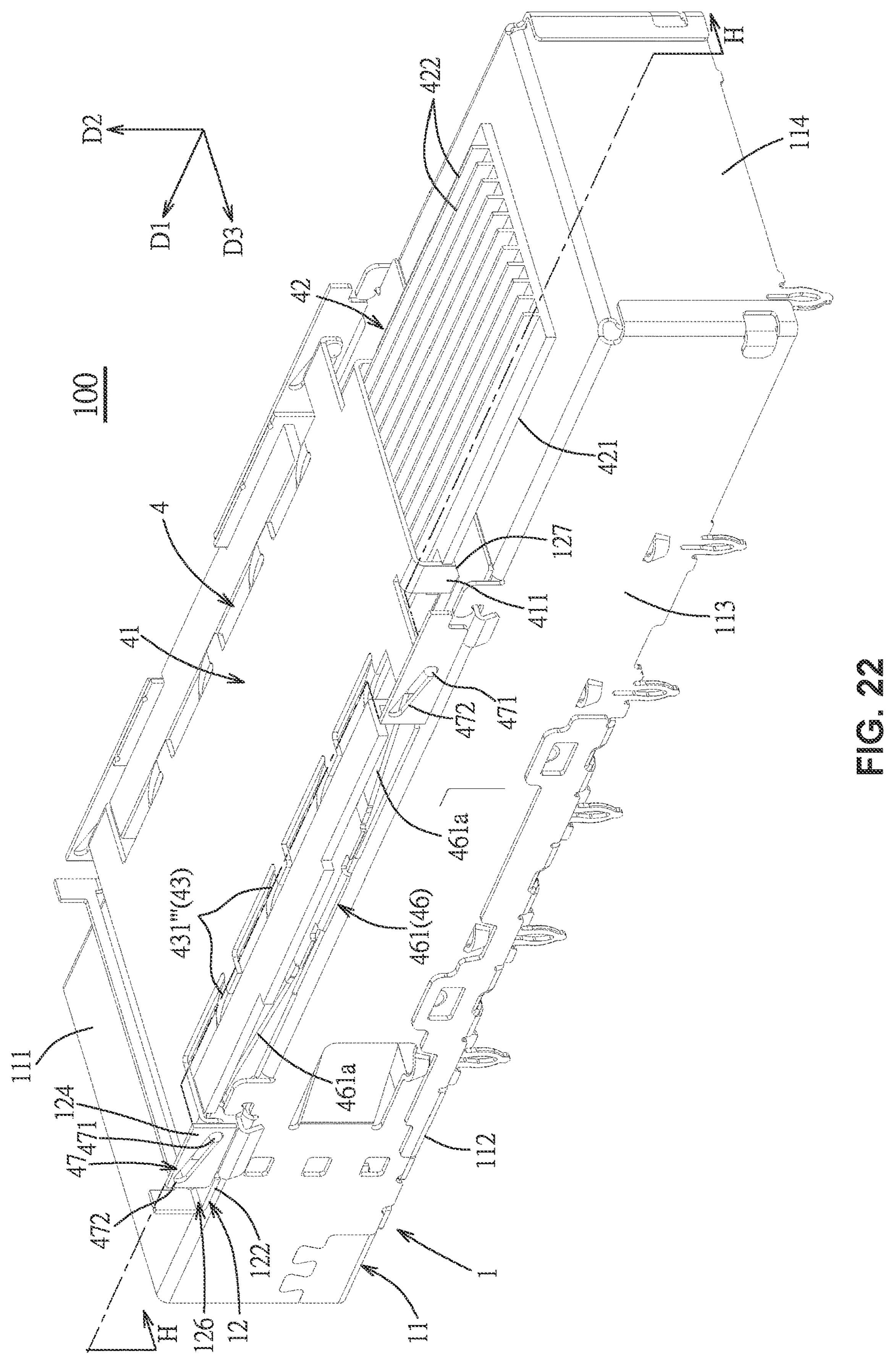
FIG. 22 is a partially cut perspective view of the fourth embodiment, in which the movable plate of the heat sink module is positioned in the second position and the heat sink of the heat sink module is positioned in the contact position, and the pluggable module is omitted.
Figure 23:
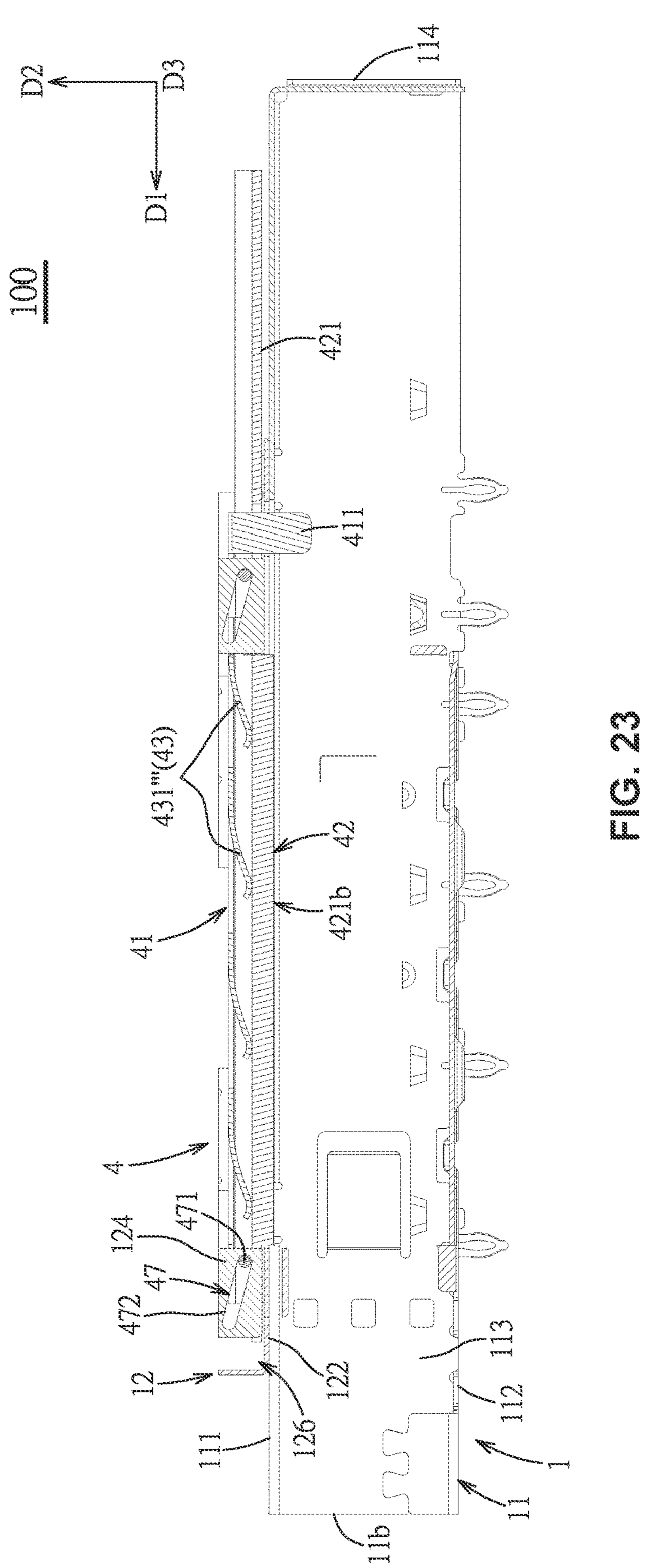
FIG. 23 is a stepped cross sectional view taken along a line H-H of FIG. 22, in which the movable plate of the heat sink module is positioned in the second position and the heat sink of the heat sink module is positioned in the contact position, and the receptacle connector and the pluggable module are omitted.
Figure 24:
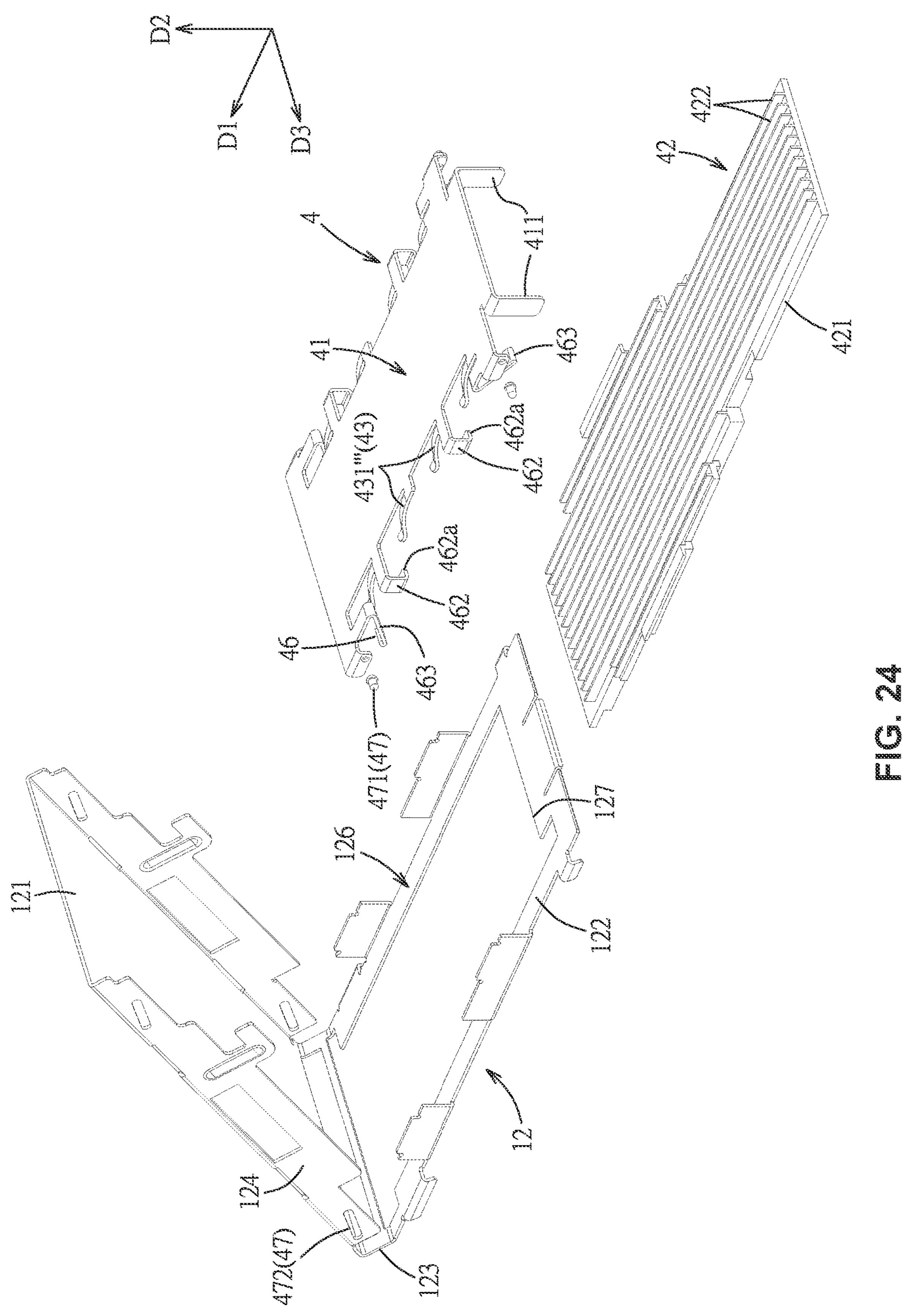
FIG. 24 is a perspective exploded view of a heat sink frame and a heat sink module of a fifth embodiment of the connector assembly of the present disclosure.

As shown in FIG. 22 to FIG. 23, when the movable plate 41 is subjected to the pushing force from the pluggable module 3 (see FIG. 1) and rearwardly moves from the first position to the second position, because the movable plate 41 moves downwardly at the same time besides moves rearwardly under the action of the movable plate guiding construction 47, so the plate spring portions 431''' of the pressure-applying spring 43 which are constructed on the movable plate 41 directly act downwardly on the heat sink 42, and the action force that the plate spring portions 431''' of the pressure-applying spring 43 which are constructed on the movable plate 41 downwardly act to the heat sink 42 is more than the action force that the two supporting spring constructions 461 of the supporting spring 46 upwardly act to the heat sink 42, in turn the plate spring portions 431''' of the pressure-applying spring 43 bring the heat sink 42 to move downwardly from the release position and move to the contact position.

When the pluggable module 3 withdraws from the inserting passageway 11*a*, the supporting spring 46 upwardly acts to the heat sink 42, makes the heat sink 42 move to the release position, the heat sink 42 will upwardly act to the plate spring portions 431''' of the pressure-applying spring 43 of the movable plate 41, so, the action of the heat sink 42 and the pressure-applying spring 43 will make the movable plate 41 move and restore to the first position which is in the up and in the front.

Referring to FIG. 24 to FIG. 28, a fifth embodiment of the connector assembly 100 of the present disclosure differs from the fourth embodiment in that, the supporting spring 46 is constructed on the movable plate 41, the supporting spring 46 includes a plurality of supporting braces 462 which are constructed on the two sides of the movable plate 41 and a plurality of elastic abutting portions 463 which are constructed on the two sides of the movable plate 41 and downwardly elastically abut against the lower wall 122 of the heat sink frame 12. Each supporting brace 462 has a supporting hook 462*a* which extends downwardly and inwardly and is used to hook a side edge of the heat sink 42. The plurality of elastic abutting portions 463 downwardly and respectively forwardly and rearwardly extend obliquely, the elastic abutting portion 463 which is further in the front obliquely extends forwardly, the elastic abutting portion 463 which is further in the rear obliquely extend rearwardly. By the elastic acting force provided by the plurality of elastic abutting portions 463 of the supporting spring 46, the plurality of supporting braces 462 of the supporting hook 462 of the supporting spring 46*a* upwardly and elastically support the heat sink 42.

Figure 25:
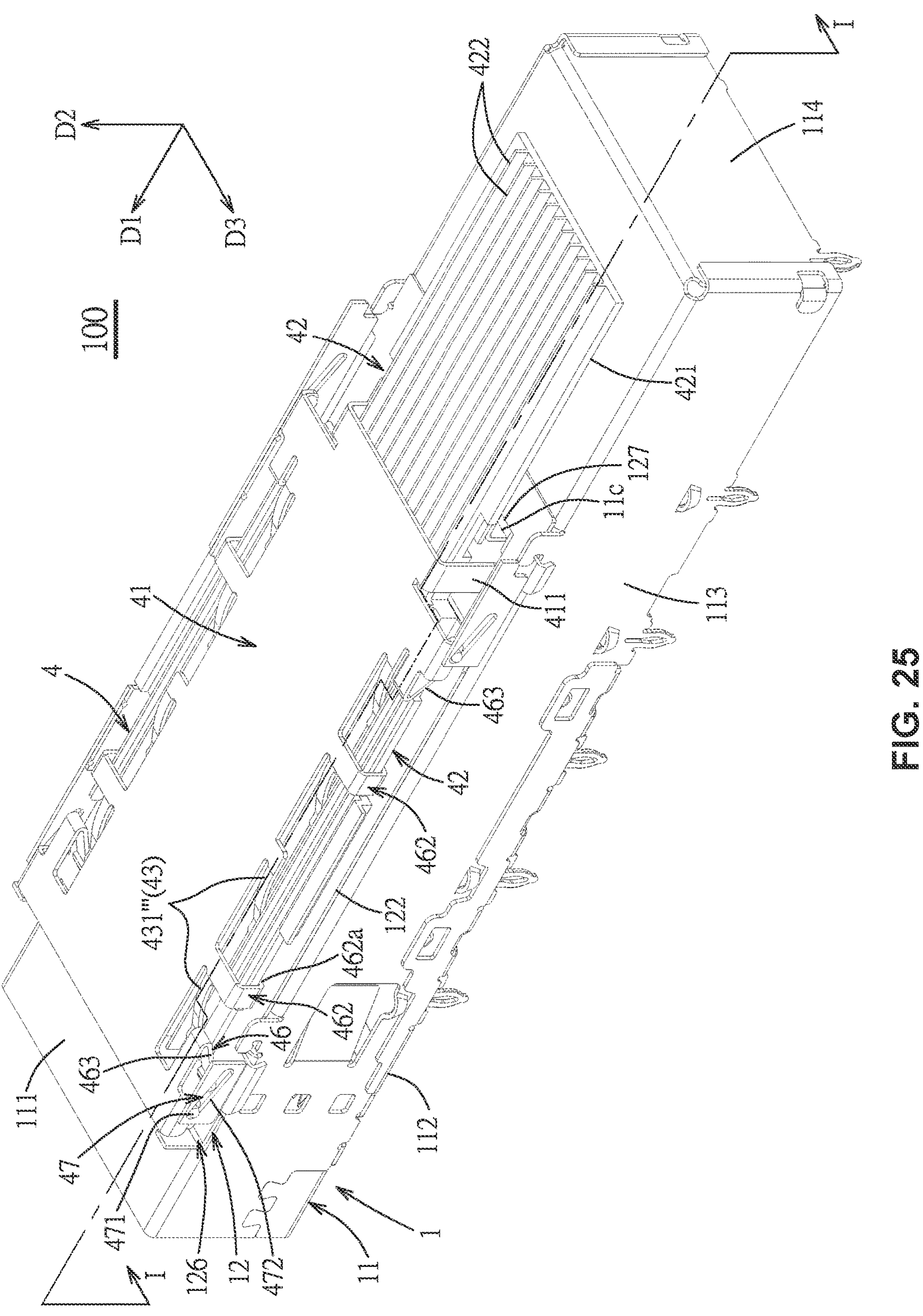
FIG. 25 is a partially cut perspective view of the fifth embodiment, in which a movable plate of the heat sink module is positioned in the first position and a heat sink of the heat sink is positioned in the release position.
Figure 26:
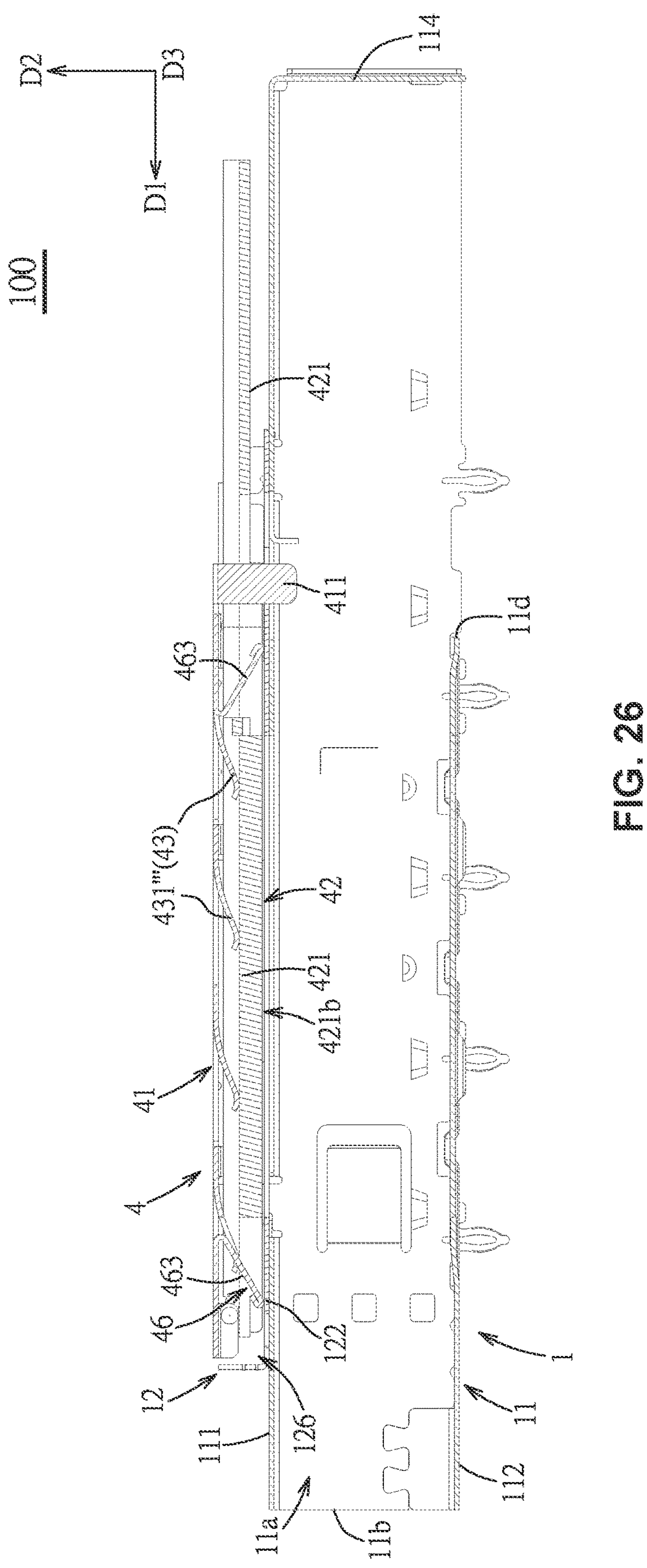
FIG. 26 is a stepped cross sectional view taken along a line I-I of FIG. 25, in which a movable plate of the heat sink module is positioned in the first position and the heat sink of the heat sink is positioned in the release position, and the receptacle connector is omitted.

As shown in FIG. 25 to FIG. 26, when the movable plate 41 is positioned in the first position which is in the up and in the front, the supporting hooks 462*a* of the plurality of supporting braces 462 of the supporting spring 46 support the heat sink 42 in the release position which is in the up.

Figure 27:
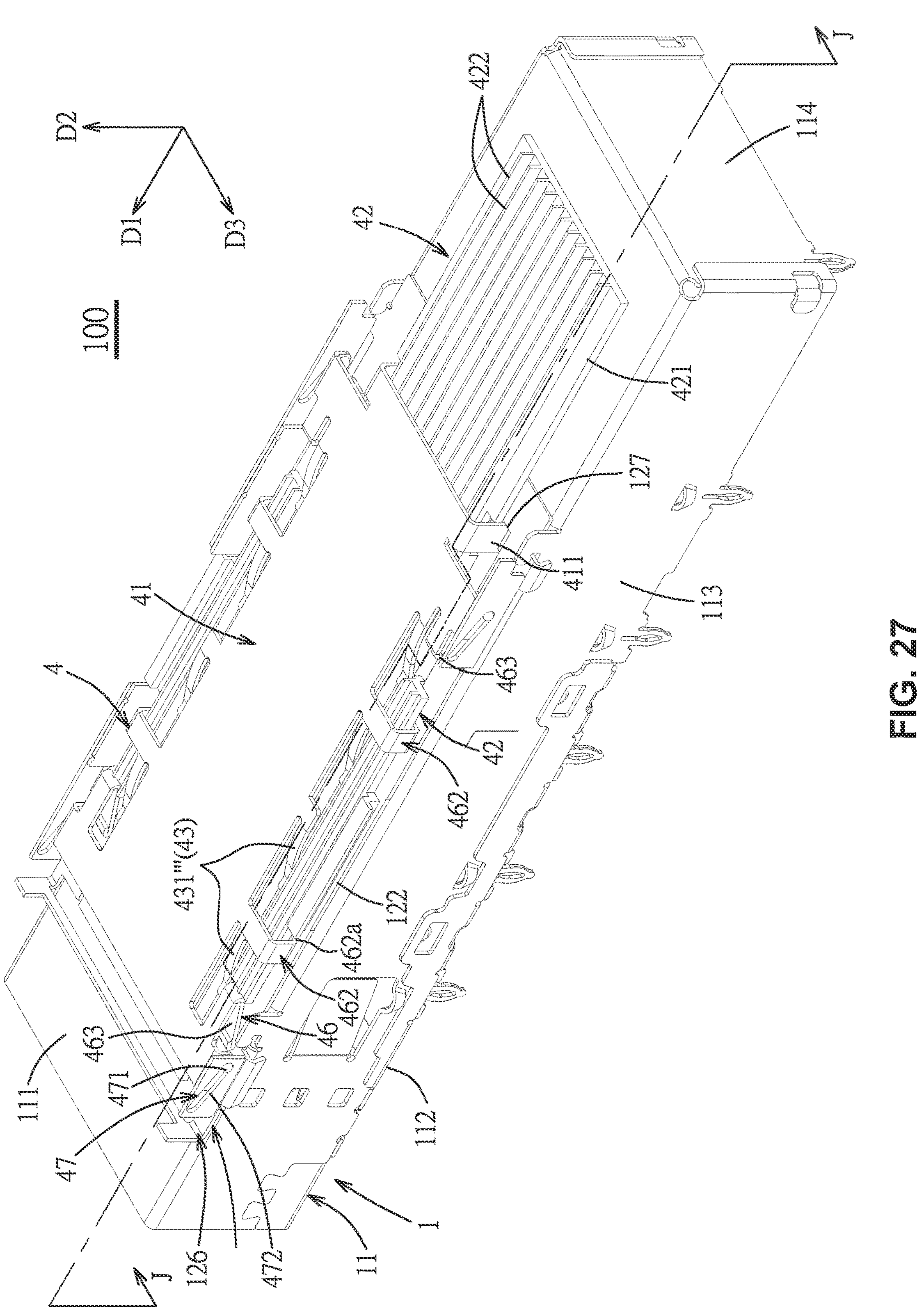
FIG. 27 is a partially cut perspective view of the fifth embodiment, in which the movable plate of the heat sink module is positioned in the second position and the heat sink of the heat sink is positioned in the contact position, and the pluggable module is omitted.
Figure 28:
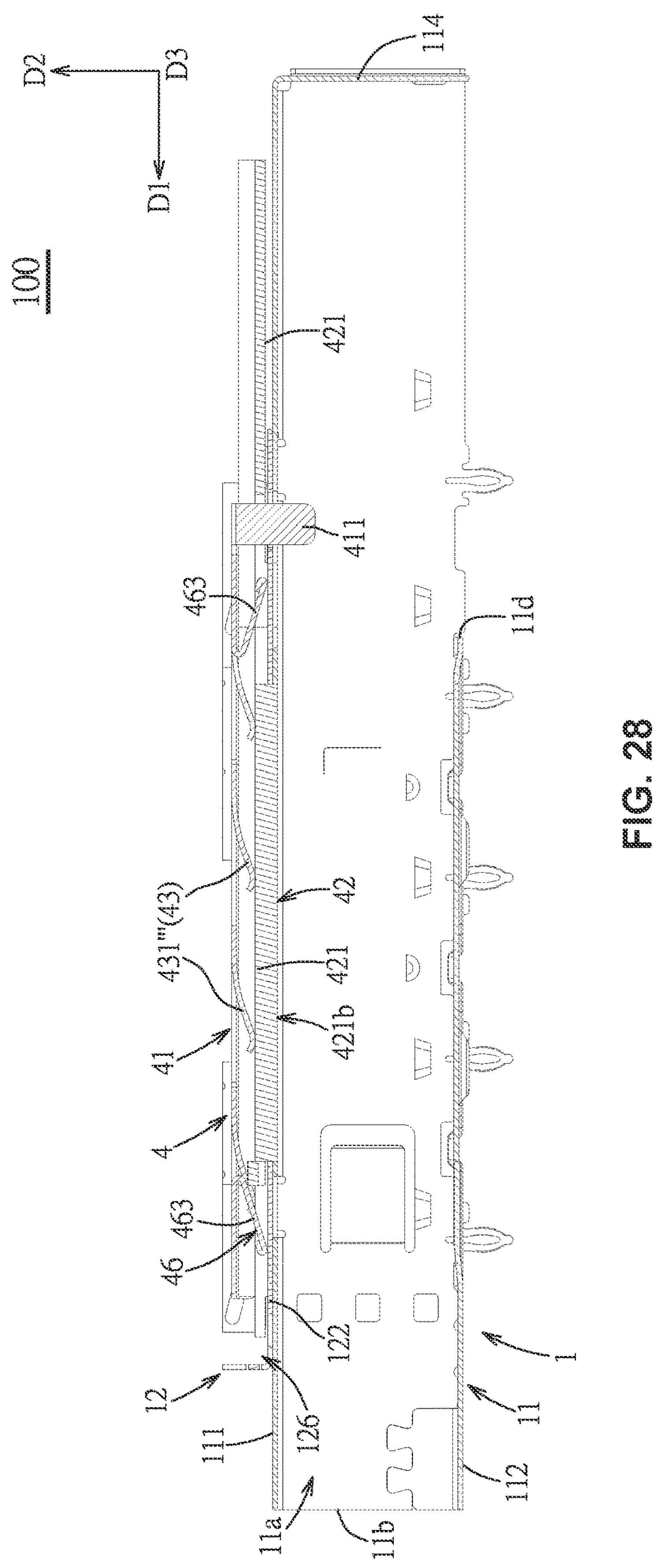
FIG. 28 is a stepped cross sectional view taken along a line J-J of FIG. 27, in which the movable plate of the heat sink module is positioned in the second position and the heat sink of the heat sink is positioned in the contact position, and the receptacle connector and the pluggable module are omitted.

As shown in FIG. 27 to FIG. 28, when the movable plate 41 is subjected to the pushing force from the pluggable module 3 (see FIG. 1) to rearwardly move from the first position to the second position, the movable plate 41 moves rearwardly and downwardly, because positions of the movable plate 41 and the supporting hooks 462*a* of the plurality of supporting braces 462 of the supporting spring 46 move downwardly, the heat sink 42 is brought to move downwardly from the release position and move to the contact position. And, at this time, the elastic acting force of the pressure-applying spring 43 makes the thermal coupling portion 421*b* on the bottom portion of the heat sink 42 downwardly and contact the surface of the pluggable module 3 with a pressure. In this state, the plurality of elastic abutting portions 463 of the supporting spring 46 are compressed and provide an elastic acting force which is upward and used to drive the movable plate 41 to restore to the first position and bring the heat sink 42 to move and restore to the release position.

When the pluggable module 3 withdraws from the inserting passageway 11*a*, the plurality of elastic abutting portions 463 of the supporting spring 46 restore from being compressed, and drive the movable plate 41 to upwardly and forwardly move and restore to the first position and bring the heat sink 42 to move upwardly and restore to the release position.

Figure 29:
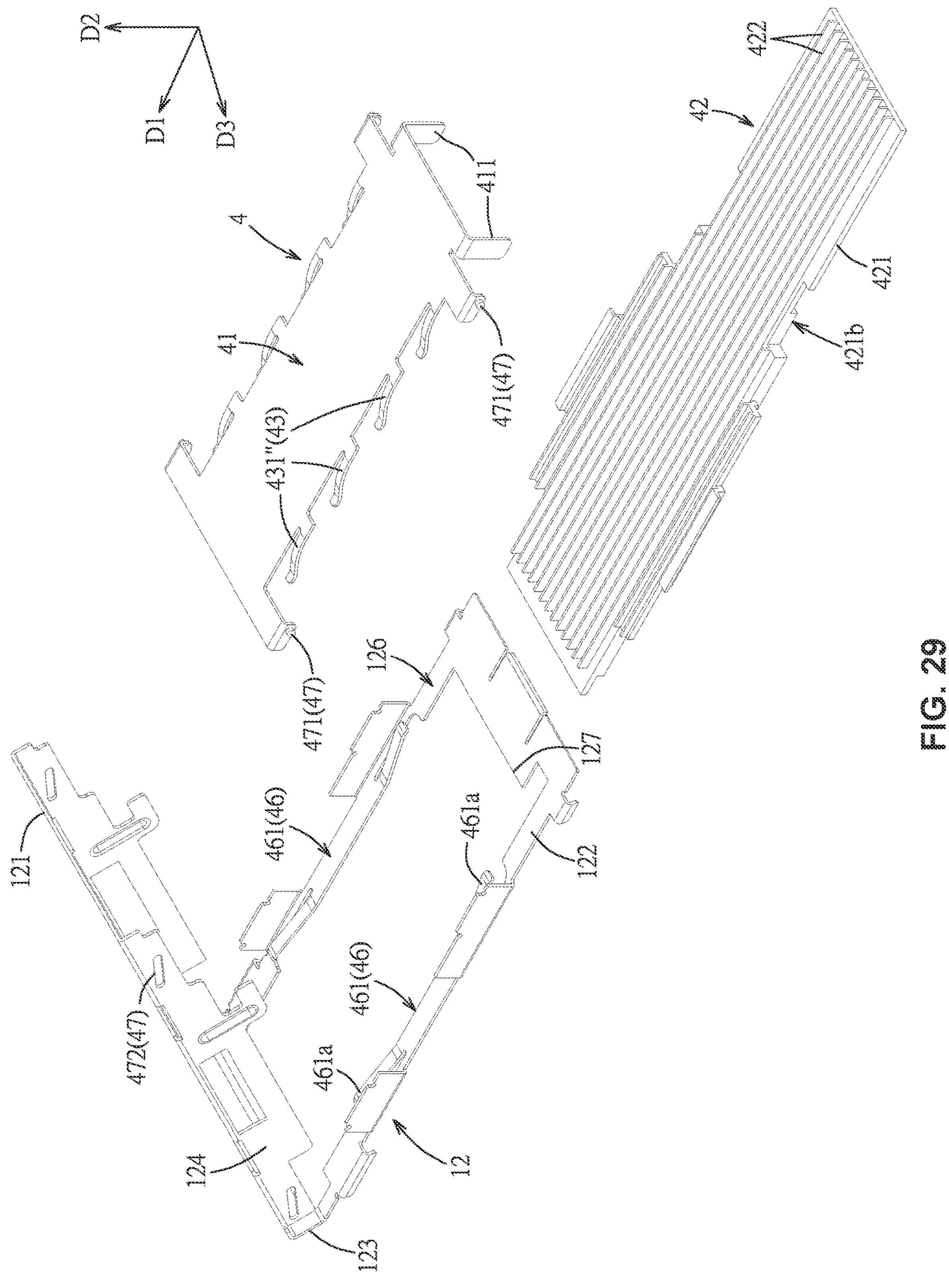
FIG. 29 is a perspective exploded view of a heat sink frame and a heat sink module of a sixth embodiment of the connector assembly of the present disclosure.

Referring to FIG. 29, a sixth embodiment of the connector assembly 100 of the present disclosure differs from the fourth embodiment in that, the two supporting spring constructions 461 of the supporting spring 46 are integrally constructed on the lower wall 122 of the heat sink frame 12 and upwardly support the left side and the right side of the heat sink 42 respectively.

Figure 30:
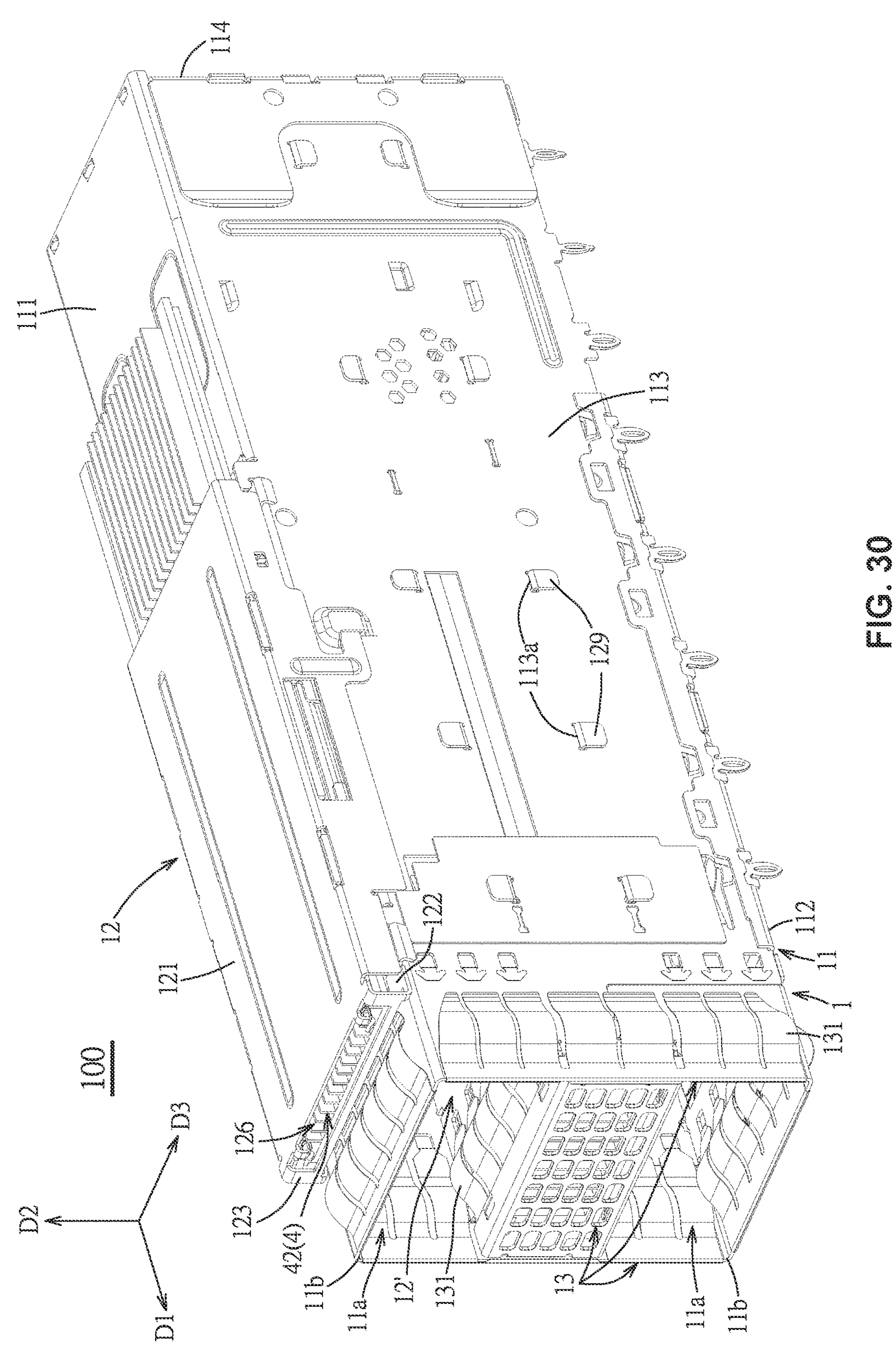
FIG. 30 is a perspective view of a seventh embodiment of the connector assembly of the present disclosure, in which the pluggable module is omitted.
Figure 31:
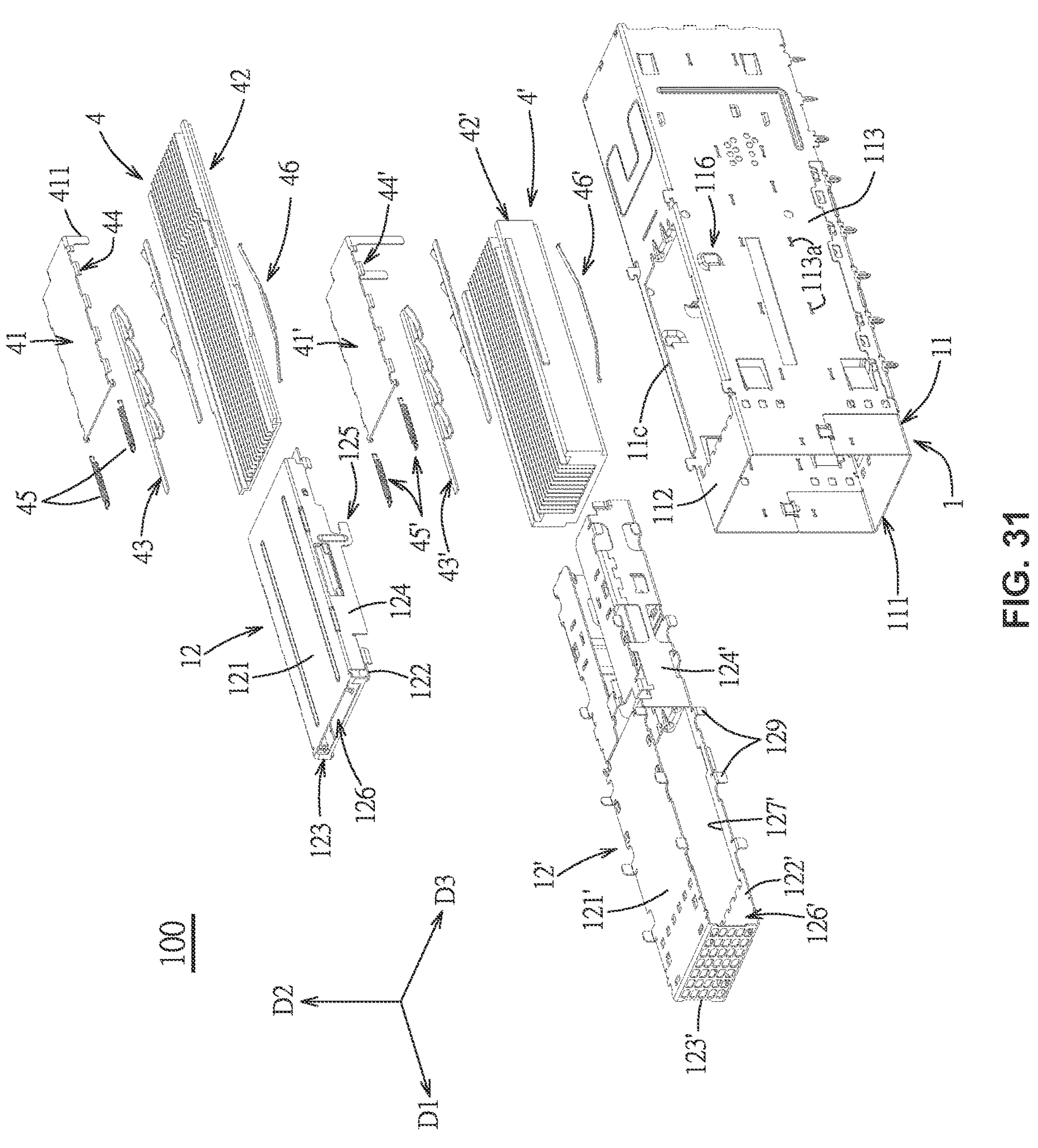
FIG. 31 is a perspective exploded view of FIG. 30.
Figure 32:
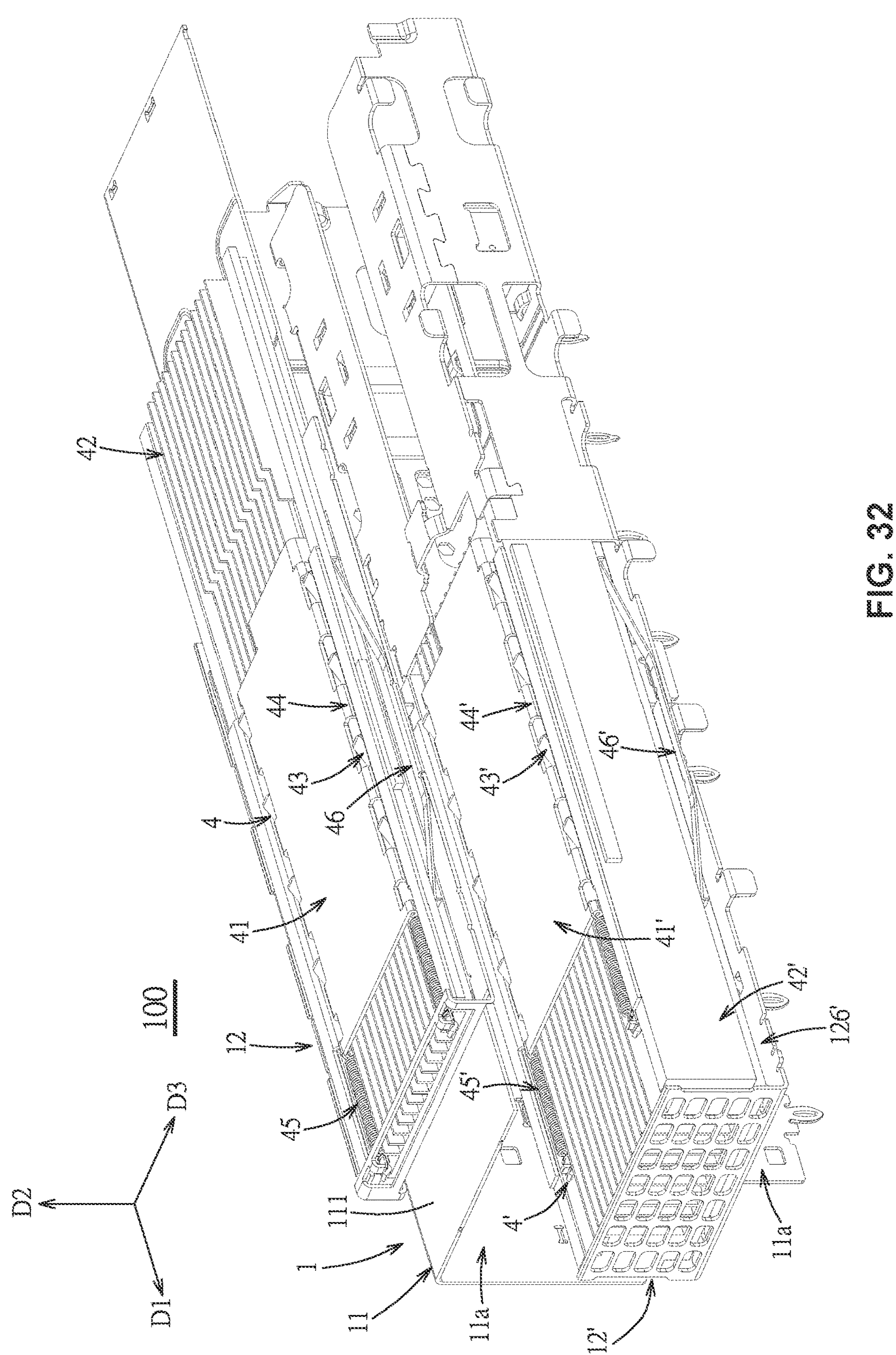
FIG. 32 is a partially cut perspective view of the seventh embodiment.

Referring to FIG. 30 to FIG. 32, a seventh embodiment of the present disclosure illustrates the connector assembly 100 which is a double layer construction, the seventh embodiment differs from the second embodiment in that, the connector assembly 100 further includes an internal heat sink frame 12' which is provided in the shell 11 of the cage 1 and an internal heat sink module 4' which is provided in the internal heat sink frame 12'. The shell 11 has two inserting passageways 11*a* which are defined together by the internal heat sink frame 12' and the shell 11, are respectively positioned in the up and in the down, and are communicated with each other at rear segment thereof, and two front end inserting ports 11*b* which are positioned at a front end of the shell 11, are respectively communicated with the two inserting passageways 11*a*, and allow the pluggable module 3 to insert therein. The heat sink frame 12 and the internal heat sink frame 12' are respectively positioned above the two inserting passageways 11*a*.

The internal heat sink frame 12' and the heat sink frame 12 are substantially the same in structure. The internal heat sink frame 12' has an upper wall 121' and a lower wall 122' which are spaced part from each other and face each other in the up-down direction, a front connecting wall 123' which connects a front end of the upper wall 121' and a front end of the lower wall 122', two side walls 124' which connect left side of the upper wall 121' and the lower wall 122' and right side of the upper wall 121' and the lower wall 122' respectively and are spaced part from each other and face each other in the left-right direction, and a plurality of fixing bendable pieces 129 which are formed to side edges of the upper wall 121' and side edges of the lower wall 122'. The shell 11 of each side wall 113 further has a plurality of fixing through-holes 113*a* which correspondingly cooperate with the plurality of fixing bendable pieces 129. The plurality of fixing bendable pieces 129 pass through the plurality of fixing through-holes 113*a* respectively and then are bent, so that the internal heat sink frame 12' is assembled to the two side walls 113 of the shell 11.

The internal heat sink frame 12' further has an internal heat sink accommodating space 126' which is defined together by the upper wall 121', the lower wall 122', the front connecting wall 123' and the two side walls 124' and accommodates the internal heat sink module 4' and a lower portion opening 127' which makes the internal heat sink accommodating space 126' communicated with the inserting passageway 11*a* in the down and is formed to the lower wall 122'. The constitution and actuating manner of the internal heat sink module 4' are substantially the same as the constitution and actuating manner of the heat sink module 4, the internal heat sink module 4' similarly includes a movable plate 41', a heat sink 42', a pressure-applying spring 43', a pressure-applying spring acting construction 44', two position-restoring springs 45', and a supporting spring 46', so detailed description thereof is not repeated herein.

Figure 33:
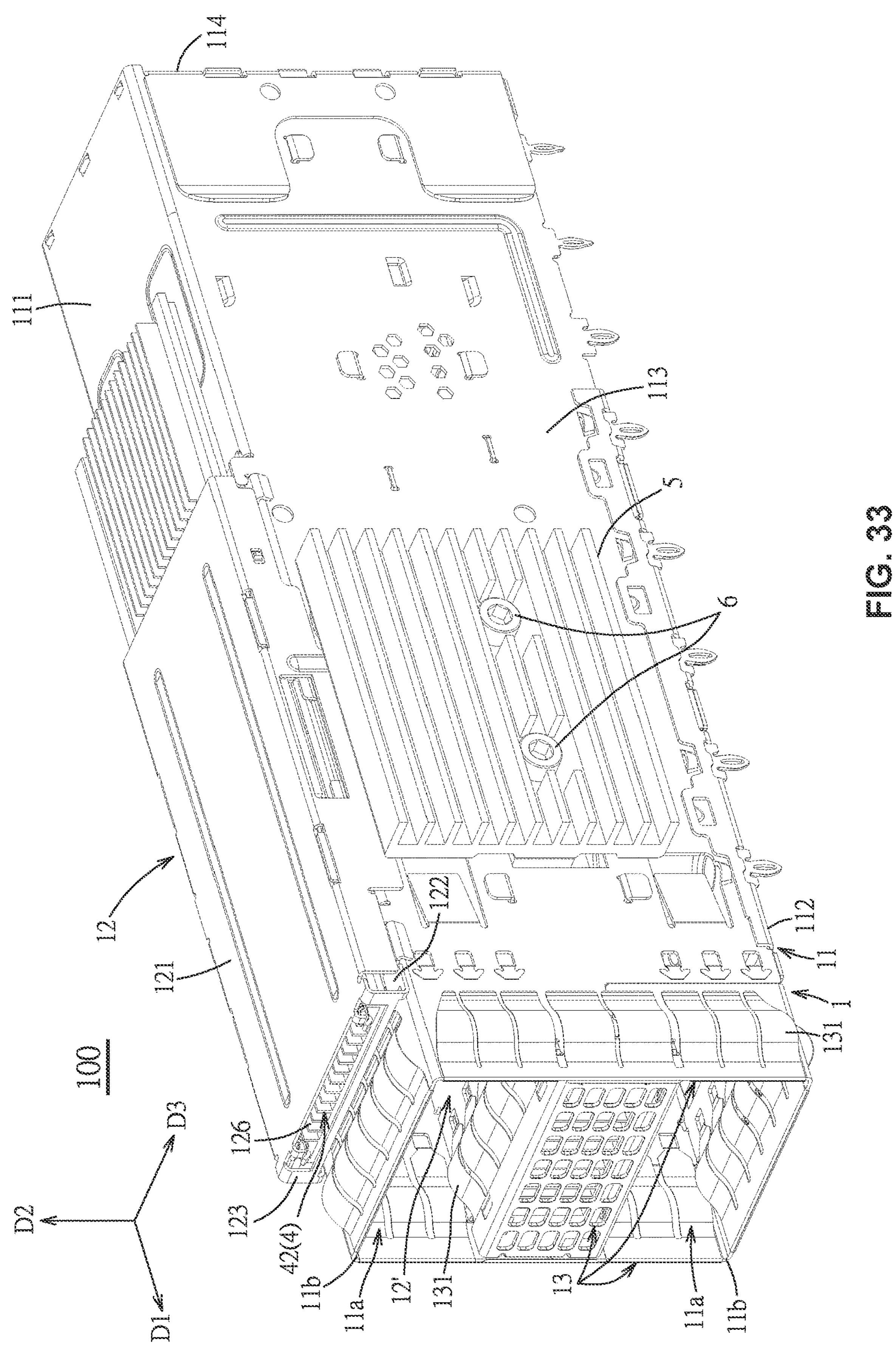
FIG. 33 is a perspective view of an eighth embodiment of the connector assembly of the present disclosure, in which the pluggable module is omitted.
Figure 34:
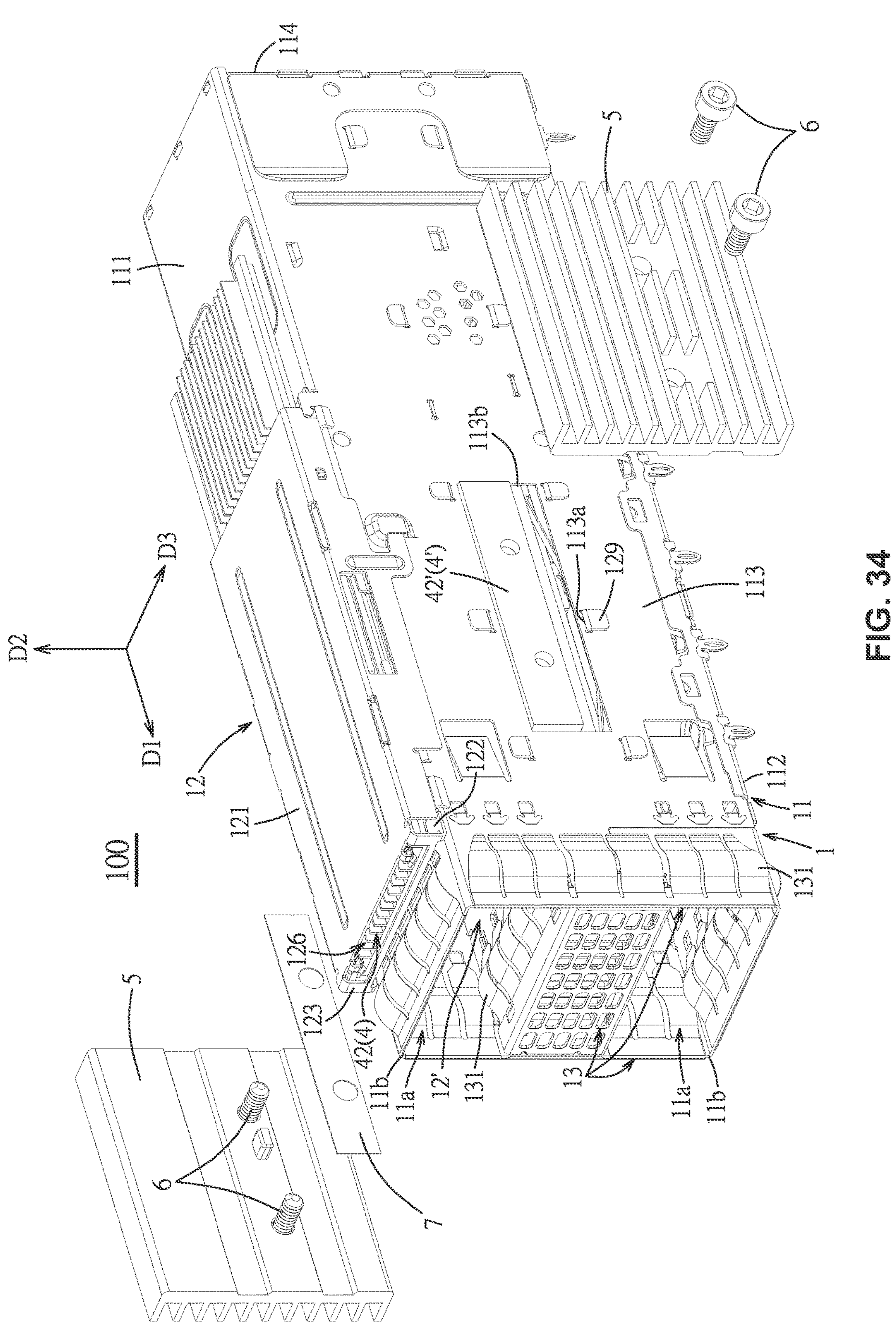
FIG. 34 is a perspective exploded view of FIG. 33.

Referring to FIG. 33 and FIG. 34, an eighth embodiment of the connector assembly 100 of the present disclosure differs from the seventh embodiment in that, the connector assembly 100 further includes two side heat sinks 5, the two side heat sinks 5 are provided to a left side and a right side of the heat sink 42' of the internal heat sink module 4' by means of side surface openings 113*b* which are formed on the two side walls 11 of the shell 11 respectively, so as to strengthen heat dissipating efficacy of the heat sink 42' of the internal heat sink module 4'. For example, the two side heat sinks 5 may be locked to the left side and the right side of the heat sink 42' of the internal heat sink module 4' by means of a plurality of fixing members 6. In addition, in the eighth embodiment, the two side heat sinks 5 and the heat sink 42' of the internal heat sink module 4' are further provided therebetween with thermal conductive gaskets 7, so as to assure thermal conductivity between the two side heat sinks 5 and the heat sink 42' of the internal heat sink module 4'.

In conclusion, in the present disclosure, by that the rearward movement of the movable plate 41 brings the pressure-applying spring 43 to move and the pressure-applying spring 43 actuates the heat sink 42 to move to the contact position where the heat sink 42 contacts the pluggable module 3, so, only after the pluggable module 3 inserts into the inserting passageway 11*a* of the cage 1, can the heat sink 42 moves to a position where the heat sink 42 contacts the surface of the pluggable module 3, so as to reduce friction situation generated between the bottom portion of the heat sink 42 and the pluggable module 3 in a process that the pluggable module 3 inserts into the connector assembly 100, prevent the bottom portion of the heat sink 42 from being worn, or prevent the thermal conductive pad 421*d* (the thermal interface material) provided to the bottom portion of the heat sink 42 from being scratched. Further, by that the elastic acting force of the pressure-applying spring 43 makes the bottom portion of the heat sink 42 downwardly contact the surface of the pluggable module 3 with a pressure, thermal transfer efficiency can be promoted and heat dissipating effect can be increased. On the other hand, by the movable plate 41 which is a thin plate construction and the pressure-applying spring 43 which is positioned between the movable plate 41 and the heat sink 42, the entire heat dissipating assembly can have a low-profile construction effect. Moreover, the plurality of the plate spring portions 431 of the pressure-applying spring 43 between the movable plate 41 and the heat sink 42 are respectively provided at the two sides of the heat sink 42 and are arranged in the front-rear direction, movement of the heat sink 42 can be more balanced and stable.

However, what is described above is just the embodiments of the present disclosure, which is not intended to limit the scope implementing the present disclosure, any simple equivalent variations and modifications made according to the claims and the specification of the present disclosure will also be fallen within the scope of the present disclosure.

What is claimed is:

1. A connector assembly, comprising:

a cage having at least one inserting passageway and a heat sink frame positioned above the inserting passageway;

a heat sink module assembled to the heat sink frame, the heat sink module comprising a movable plate, a heat sink, a pressure-applying spring and a supporting spring, the movable plate being positioned above the heat sink and having a pushed portion which enters into the inserting passageway, the pressure-applying spring being provided between the movable plate and the heat sink, the supporting spring upwardly and elastically supporting the heat sink, the movable plate being capable of moving relative to the heat sink frame between a first position which is in the front and a second position which is in the rear, and the heat sink being capable of moving relative to the heat sink frame between a release position which is in an upwards direction and a contact position which is in a downwards direction; and a pluggable module capable of being inserted into the inserting passageway of the cage along an inserting direction which is from front to rear so as to push the pushed portion of the movable plate and make the movable plate rearwardly move from the first position to the second position, in turn the movable plate bringing the pressure-applying spring to move the heat sink from the release position which is in the upwards direction to the contact position which is in the downwards direction and make the supporting spring compressed, an elastic acting force of the pressure-applying spring making a bottom portion of the heat sink downwardly contact a surface of the pluggable module with a pressure, when the pluggable module withdraws from the inserting passageway, the supporting spring upwardly raising the heat sink to the release position where the heat sink does not contact the surface of the pluggable module, the pressure-applying spring actuating the movable plate to forwardly move to the first position.

2. The connector assembly of claim 1, wherein the pressure-applying spring is integrally constructed on the movable plate;

the heat sink frame is constructed with a pressure-applying spring acting construction; and when the movable plate rearwardly moves from the first position to the second position, the pressure-applying spring on the movable plate and the pressure-applying spring acting construction of the heat sink frame act to make the movable plate downwardly move and in turn bring the heat sink to move downwardly from the release position and to the contact position.

3. The connector assembly of claim 2, wherein the pressure-applying spring comprises a plurality of plate spring portions which are constructed to two sides of the movable plate and are arranged in a front-rear direction, the plurality of plate spring portions of the pressure-applying spring obliquely extend forwardly and upwardly, the heat sink frame has an upper wall, the pressure-applying spring acting construction comprises a plurality of interfering pieces which are constructed to the upper wall of the heat sink frame, when the movable plate is positioned in the first position, the interfering pieces of the pressure-applying spring acting construction are respectively positioned behind the plate spring portions of the pressure-applying spring, and when the movable plate is positioned in the second position, the interfering pieces of the pressure-applying spring acting construction downwardly act to the plate spring portions of the pressure-applying spring.

4. The connector assembly of claim 1, wherein the pressure-applying spring is assembled on the heat sink, the movable plate is constructed with a pressure-applying spring acting construction, and when the movable plate rearwardly moves from the first position to the second position, the pressure-applying spring acting construction on the movable plate and the pressure-applying spring on the heat sink act in turn to bring the heat sink to move downwardly from the release position and move to the contact position.

5. The connector assembly of claim 4, wherein the pressure-applying spring comprises a plurality of plate spring portions which are assembled to two sides of the heat sink and are arranged in a front-rear direction, the plurality of plate spring portions of the pressure-applying spring obliquely extend rearwardly and upwardly, the pressure-applying spring acting construction comprises a plurality of interfering pieces which are constructed to two sides of the movable plate, when the movable plate is positioned in the first position, the interfering pieces of the pressure-applying spring acting construction are respectively positioned in front of the plate spring portions of the pressure-applying spring, and when the movable plate is positioned in the second position, the interfering pieces of the pressure-applying spring acting construction downwardly act to the plate spring portions of the pressure-applying spring.

6. The connector assembly of claim 1, wherein the pressure-applying spring is integrally constructed on the movable plate, the heat sink is constructed with a pressure-applying spring acting construction, and when the movable plate rearwardly moves from the first position to the second position, the pressure-applying spring on the movable plate and the pressure-applying spring acting construction of the heat sink act in turn to move the heat sink downwardly from the release position to the contact position.

7. The connector assembly of claim 6, wherein the pressure-applying spring comprises a plurality of plate spring portions which are constructed to two sides of the movable plate and are arranged in a front-rear direction, the plurality of plate spring portions of the pressure-applying spring obliquely extend forwardly and downwardly, the pressure-applying spring acting construction comprises a plurality of interfering oblique surfaces which are constructed to two sides of the heat sink and obliquely extend rearwardly and upwardly, when the movable plate is positioned in the first position, the interfering oblique surfaces of the pressure-applying spring acting construction are respectively positioned behind the plate spring portions of the pressure-applying spring, and when the movable plate is positioned in the second position, the plate spring portions of the pressure-applying spring downwardly act to the interfering oblique surfaces of the pressure-applying spring acting construction.

8. The connector assembly of claim 1, wherein the heat sink module further comprises a position-restoring spring which is provided between the heat sink frame and the movable plate, the position-restoring spring being used to provide an elastic acting force for the movable plate moving to the first position.

9. The connector assembly of claim 8, wherein the heat sink frame has a first hook portion which is positioned at a front end of the heat sink frame, the movable plate has a second hook portion which is positioned at a front end of the movable plate, and the position-restoring spring is a coil spring, a front end of the position-restoring spring connecting the first hook portion, and a rear end of the position-restoring spring connecting the second hook portion.

10. The connector assembly of claim 1, wherein the supporting spring comprises at least two supporting spring constructions, the two supporting spring constructions being respectively constructed on the heat sink frame and supporting a left side and a right side of the heat sink.

11. The connector assembly of claim 10, wherein the supporting spring construction comprises two elastic supporting portions which upwardly support the heat sink and are plate-shaped.

12. The connector assembly of claim 1, wherein the heat sink frame and the heat sink are provided therebetween with a heat sink guiding construction, the heat sink guiding construction limiting movement of the heat sink in a front-rear direction and guiding movement of the heat sink in an up-down direction.

13. The connector assembly of claim 12, wherein the heat sink guiding construction comprises guiding holes which are constructed on side walls of the heat sink frame and guiding protrusions which are constructed on side edges of the heat sink, the guiding protrusions being provided to the guiding holes and being capable of moving up and down.

14. A connector assembly, comprising:

a cage having at least one inserting passageway and at least one heat sink frame positioned above the inserting passageway;

at least one heat sink module assembled to the heat sink frame, the heat sink module comprising a movable plate, a heat sink, a pressure-applying spring, a supporting spring and a movable plate guiding construction, the movable plate being positioned above the heat sink and having a pushed portion which enters into the inserting passageway, the pressure-applying spring being provided between the movable plate and the heat sink, the supporting spring upwardly and elastically supporting the heat sink, the movable plate being capable of being guided by the movable plate guiding construction to move relative to the heat sink frame between a first position which is in the front and in an upwards direction and a second position which is in the rear and in a downwards direction, and the heat sink being capable of moving relative to the heat sink frame between a release position which is in the upwards direction and a contact position which is in the downwards direction; and a pluggable module capable of being inserted into the inserting passageway of the cage along an inserting direction which is from front to rear to push the pushed portion of the movable plate and make the movable plate rearwardly move from the first position to the second position, in turn the movable plate bringing the pressure-applying spring to move and actuate the heat sink to move from the release position which is in the upwards direction to the contact position which is in the downwards direction and make the supporting spring compressed, an elastic acting force of the pressure-applying spring making a bottom portion of the heat sink downwardly contact a surface of the pluggable module with a pressure, when the pluggable module withdraws from the inserting passageway, the supporting spring upwardly raising the heat sink to move to the release position where the heat sink does not contact the surface of the pluggable module, the pressure-applying spring actuating the movable plate to forwardly move to the first position.

15. The connector assembly of claim 14, wherein the heat sink frame has side walls, the movable plate guiding construction comprises guiding members and guiding grooves which cooperate with each other, the guiding grooves are constructed on the side walls of the heat sink frame and obliquely extend rearwardly and downwardly, and the guiding members are constructed on side edges of the movable plate and are assembled into the guiding grooves, the guiding members being capable of moving along the guiding grooves.

16. The connector assembly of claim 15, wherein the pressure-applying spring is integrally constructed on the movable plate, and when the movable plate rearwardly moves from the first position to the second position, the pressure-applying spring on the movable plate directly acts to the heat sink, in turn bringing the heat sink to move downwardly from the release position to the contact position.

17. The connector assembly of claim 16, wherein the pressure-applying spring comprises a plurality of plate spring portions which are constructed to two sides of the movable plate and are arranged in a front-rear direction, the plurality of plate spring portions of the pressure-applying spring obliquely extending forwardly and downwardly.

18. The connector assembly of claim 14, wherein the supporting spring is constructed on the movable plate, and the supporting spring comprises a supporting brace which braces the heat sink from down to up, the supporting brace of the supporting spring upwardly and elastically supporting the heat sink.

19. The connector assembly of claim 18, wherein the heat sink frame has a lower wall, the supporting spring comprises a plurality of the supporting braces which are constructed to two sides of the movable plate and a plurality of elastic abutting portions which are constructed to the two sides of the movable plate and downwardly elastically abut against the lower wall of the heat sink frame, each of the supporting braces has a supporting hook which extends downwardly and inwardly and is used to hook a respective side edge of the heat sink, and the plurality of elastic abutting portions extend obliquely.

20. The connector assembly of claim 14, wherein
the supporting spring comprises at least two supporting spring constructions, and
the two supporting spring constructions are respectively constructed on the heat sink frame and support a left side and a right side of the heat sink.

21. The connector assembly of claim 20, wherein
each of the supporting spring constructions comprises two elastic supporting portions which upwardly support the heat sink and are plate-shaped.

22. The connector assembly of claim 14, wherein
the heat sink frame and the heat sink are provided therebetween with a heat sink guiding construction, the heat sink guiding construction limiting movement of the heat sink in a front-rear direction and guiding movement of the heat sink in an up-down direction.

23. The connector assembly of claim 22, wherein
the heat sink guiding construction comprises guiding holes which are constructed on side walls of the heat sink frame and guiding protrusions which are constructed on side edges of the heat sink, the guiding protrusions being provided to the guiding holes and being capable of moving up and down.

* * * * *